(12) United States Patent
Wang et al.

(10) Patent No.: US 11,205,478 B2
(45) Date of Patent: Dec. 21, 2021

(54) MEMORY DEVICE AND A METHOD FOR FORMING THE MEMORY DEVICE

(71) Applicant: GLOBALFOUNDRIES Singapore Pte. Ltd., Singapore (SG)

(72) Inventors: Lanxiang Wang, Singapore (SG); Juan Boon Tan, Singapore (SG); Shyue Seng Tan, Singapore (SG); Eng Huat Toh, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 10 days.

(21) Appl. No.: 16/458,223

(22) Filed: Jul. 1, 2019

(65) Prior Publication Data
US 2021/0005251 A1    Jan. 7, 2021

(51) Int. Cl.
*H01L 27/24* (2006.01)
*G11C 11/56* (2006.01)
(Continued)

(52) U.S. Cl.
CPC ........ *G11C 11/5685* (2013.01); *G11C 11/161* (2013.01); *G11C 11/1697* (2013.01); *G11C 11/5607* (2013.01); *G11C 11/5678* (2013.01); *G11C 13/0004* (2013.01); *G11C 13/0007* (2013.01); *G11C 13/0038* (2013.01);
(Continued)

(58) Field of Classification Search
CPC ............... H01L 27/228; H01L 27/2436; H01L 27/2463; H01L 27/2472
See application file for complete search history.

(56) References Cited

U.S. PATENT DOCUMENTS

| 2005/0151277 A1* | 7/2005 | Kawazoe | G11C 13/003 |
| | | | 257/296 |
| 2014/0085966 A1* | 3/2014 | Song | H01L 29/41791 |
| | | | 365/154 |

(Continued)

OTHER PUBLICATIONS

"Capacitive coupling." Wikipedia. URL: https://en.wikipedia.org/wiki/Capacitive_coupling Accessed Feb. 12, 2021. (Year: 2020).*
(Continued)

*Primary Examiner* — Lynne A Gurley
*Assistant Examiner* — Peter M Albrecht
(74) *Attorney, Agent, or Firm* — Viering Jentschura & Partner MBB

(57) ABSTRACT

A memory device may include a substrate having conductivity regions and a channel region. A first voltage line may be arranged over the channel region. Second, third, and fourth voltage lines may each be electrically coupled to a conductivity region. Resistive units may be arranged between the third voltage line and the conductivity region electrically coupled to the third voltage line, and between the fourth voltage line and the conductivity region electrically coupled to the fourth voltage line. A resistance adjusting element may have at least a portion arranged between one of the resistive units and one of the conductivity regions. An amount of the resistance adjusting element between the first resistive unit and the conductivity region electrically coupled to the third voltage line may be different from that between the second resistive unit and the conductivity region electrically coupled to the fourth voltage line.

20 Claims, 13 Drawing Sheets

(51) Int. Cl.
*H01L 45/00* (2006.01)
*G11C 11/16* (2006.01)
*G11C 13/00* (2006.01)
*H01L 27/22* (2006.01)
*H01L 43/10* (2006.01)
*H01L 43/12* (2006.01)

(52) U.S. Cl.
CPC ........ *H01L 27/228* (2013.01); *H01L 27/2436* (2013.01); *H01L 43/10* (2013.01); *H01L 43/12* (2013.01); *H01L 45/06* (2013.01); *H01L 45/1253* (2013.01); *H01L 45/144* (2013.01); *H01L 45/146* (2013.01); *H01L 45/16* (2013.01)

(56) References Cited

U.S. PATENT DOCUMENTS

2014/0353662 A1* 12/2014 Shukh ................ H01L 27/2436
257/43
2018/0267743 A1* 9/2018 Park ...................... H01L 45/124

OTHER PUBLICATIONS

Wei et al., "Highly Reliable TaOx ReRAM and Direct Evidence of Redox Reaction Mechanism", 2008 IEEE International Electron Devices Meeting, 2008, 4 pages, IEEE.

Tseng et al., "High Density and Ultra Small Cell Size of Contact ReRAM (CR-RAM) in 90nm CMOS Logic Technology and Circuits", 2009 IEEE International Electron Devices Meeting (IEDM), 2009, pp. 109-112, IEEE.

Kim et al., "Improvement of Characteristics of NbO2 Selector and Full Integration of 4F2 2x-nm tech 1S1R ReRAM", 2015 IEEE International Electron Devices Meeting (IEDM), 2015, pp. 249-252, IEEE.

Ishigaki et al., "A Multi-Level-Cell Spin-Transfer Torque Memory with Series-Stacked Magnetotunnel Junctions", 2010 Symposium on VLSI Technology, 2010, pp. 47-48, IEEE.

* cited by examiner

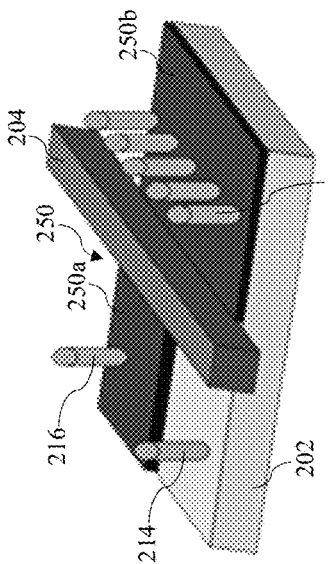
FIG. 4A
FIG. 4B
FIG. 4C
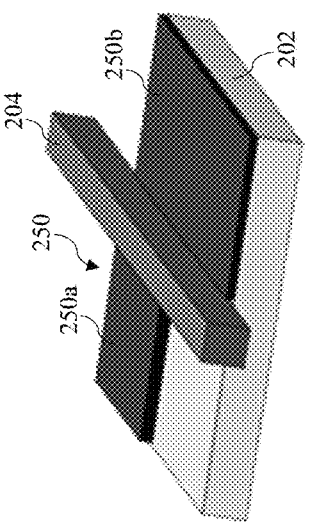
FIG. 4D
FIG. 4E
FIG. 4F
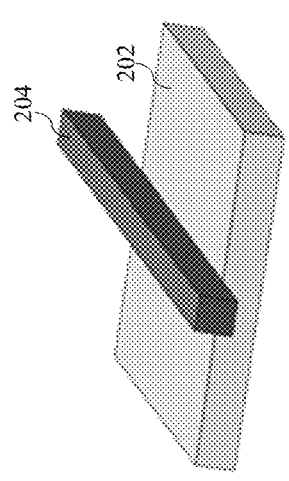
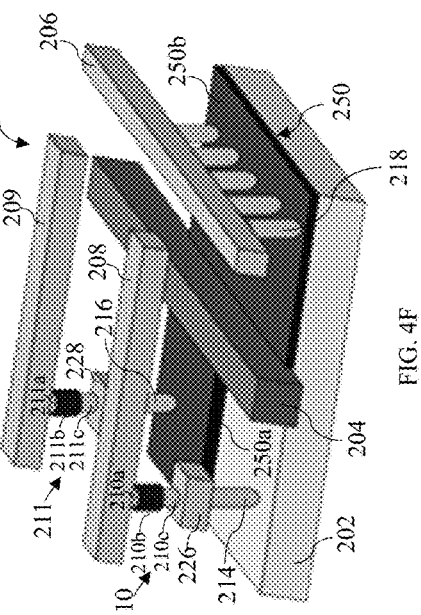
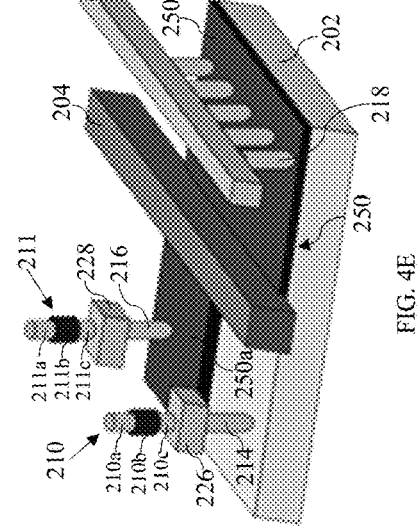
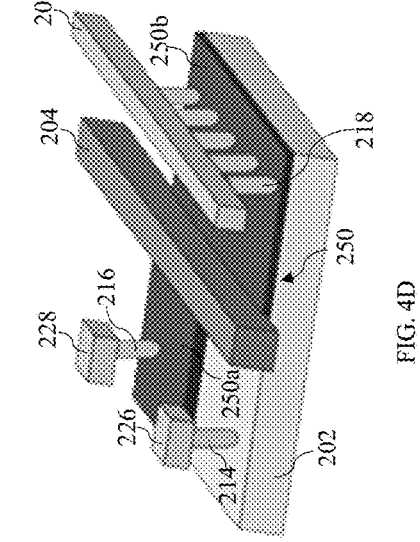

MEMORY DEVICE AND A METHOD FOR FORMING THE MEMORY DEVICE

TECHNICAL FIELD

The present disclosure relates generally to memory devices and methods for forming the memory devices.

BACKGROUND

Non-volatile memory devices are often used in various consumer electronic products such as smart phones and tablets. There are various types of non-volatile memory devices such as resistive random access memory devices (ReRAMs), magnetic random access memory devices (MRAMs) and phase-change magnetic random access memory devices (PCRAMs).

ReRAMs generally operate with a fast speed and low operation voltage. Further, the process of forming ReRAMs usually has a low process complexity. Therefore, ReRAMs are useful for high-density and high-speed non-volatile memory applications. A ReRAM typically uses a resistive layer such as a dielectric layer sandwiched between a top electrode and a bottom electrode. The resistive layer is normally insulating. However, upon application of a sufficiently high voltage difference between the top and bottom electrodes, a dielectric breakdown event can occur and this can in turn form a conducting filament between the top and bottom electrodes. The resistive layer thus becomes conductive via the conducting filament. The resistive layer can be made insulating again by applying a sufficiently low voltage difference to the top and bottom electrodes to break the conducting filament. A conventional ReRAM can switch between states based on the resistance of the resistive layer. When the resistive layer is insulating, the resistive layer has a high resistance (in other words, is in a high resistance state (HRS)) and the ReRAM is in a high (H(01)) state. When the resistive layer is conductive, the resistive layer has a low resistance (in other words, is in a low resistance state (LRS)) and the ReRAM is in a low (L(00)) state. To set the ReRAM, the ReRAM is switched from the high (H(01)) state to the low (L(00)) state, whereas to reset the ReRAM, the ReRAM is switched from the low (L(00)) state to the high (H(01)) state. The setting and resetting of the ReRAM is done by applying predetermined voltage differences to the top and bottom electrodes to form and break the conducting filament.

To date, several types of ReRAMs have been developed, some of which have been commercialized. For example, FIGS. 1A and 1B show a perspective view and an equivalent circuit of a prior art ReRAM 100 respectively. The ReRAM 100 includes a substrate 102 including a source region, a drain region and a channel region (not shown in the figures). A bit line (BL) 106 is electrically coupled to the drain region, a source line (SL) 108 is electrically coupled to the source region and a word line (WL) 104 is arranged over the channel region between the source and drain regions. ReRAM 100 further includes a resistive unit (RU) 110 arranged between the source line 108 and the source region. The resistive unit 110 includes a resistive layer sandwiched between a top electrode and a bottom electrode. To set the ReRAM 100, a voltage of 2.5V is applied to the source line 108 to switch the ReRAM 100 to the low (L(00)) state. To reset the ReRAM 100, a voltage of 1.25V is applied to the source line 108 to switch the ReRAM 100 to the high (H(01)) state. During the set and reset operations, the write line 104 is kept at a constant voltage of 2.5V and the bit line 106 is kept at a constant voltage of 0V. To read the ReRAM 100, a voltage $V_{DD}$ is applied to the write line 104, a voltage of 0V is applied to the source line 108 and a voltage of 0.1V is applied to the bit line 106.

Although prior art memory devices, such as ReRAM 100, can function as high speed non-volatile memory devices, they are only capable of switching between two states and hence, the types of applications in which they can be used are limited. Accordingly, it is desirable to provide an improved memory device that can be used in a greater number of applications.

SUMMARY

According to various non-limiting embodiments, there may be provided a memory device including a substrate including a first conductivity region and a second conductivity region at least partially arranged within the substrate, and a channel region arranged between the first conductivity region and the second conductivity region; a first voltage line arranged over the channel region; a second voltage line electrically coupled to the first conductivity region; a third voltage line electrically coupled to one of the conductivity regions; and a fourth voltage line electrically coupled to one of the conductivity regions; a first resistive unit arranged between the third voltage line and the conductivity region to which the third voltage line is electrically coupled, and a second resistive unit arranged between the fourth voltage line and the conductivity region to which the fourth voltage line is electrically coupled; a resistance adjusting element having at least a portion arranged between one of the resistive units and one of the conductivity regions. An amount of the resistance adjusting element between the first resistive unit and the conductivity region to which the third voltage line is electrically coupled may be different from an amount of the resistance adjusting element between the second resistive unit and the conductivity region to which the fourth voltage line is electrically coupled. The resistance between the third voltage line and the conductivity region to which the third voltage line is electrically coupled may differ from the resistance between the fourth voltage line and the conductivity region to which the fourth voltage line is electrically coupled.

According to various non-limiting embodiments, there may be provided a method including providing a substrate including a first conductivity region and a second conductivity region at least partially within the substrate, wherein a channel region may be arranged between the first conductivity region and the second conductivity region, and wherein a first voltage line may be formed over the channel region of the substrate; forming a resistance adjusting element over at least a portion of the substrate; forming a second voltage line over the substrate, wherein the second voltage line may be electrically coupled to the first conductivity region; forming a third voltage line, a fourth voltage line, a first resistive unit and a second resistive unit over the substrate, wherein each of the third voltage line and fourth voltage line may be electrically coupled to one of the conductivity regions, wherein the first resistive unit may be arranged between the third voltage line and the conductivity region to which the third voltage line is electrically coupled, and wherein the second resistive unit may be arranged between the fourth voltage line and the conductivity region to which the fourth voltage line is electrically coupled. The resistive units may be formed such that the resistance adjusting element has at least a portion arranged between one of the resistive units and one of the conductivity regions.

An amount of the resistance adjusting element between the first resistive unit and the conductivity region to which the third voltage line is electrically coupled may be different from an amount of the resistance adjusting element between the second resistive unit and the conductivity region to which the fourth voltage line is electrically coupled. The resistance between the third voltage line and the conductivity region to which the third voltage line is electrically coupled may differ from the resistance between the fourth voltage line and the conductivity region to which the fourth voltage line is electrically coupled.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Embodiments of the invention will now be illustrated for the sake of example only with reference to the following drawings, in which:

FIGS. 4A to 4F show perspective views that illustrate a method for fabricating the memory device of FIGS. 2A to 2E according to various non-limiting embodiments;

DETAILED DESCRIPTION

Figure 1B:
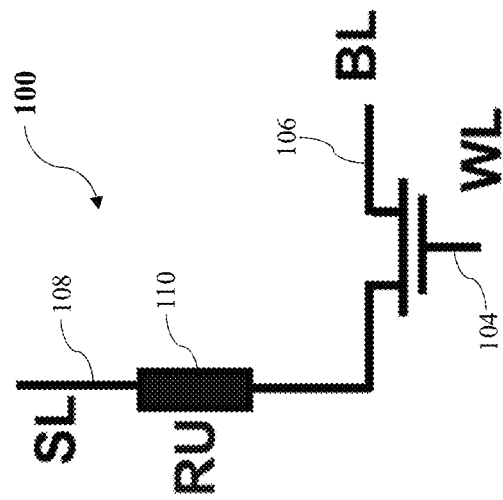
FIGS. 1A and 1B show a perspective view and an equivalent circuit of a prior art ReRAM.
Figure 1A:
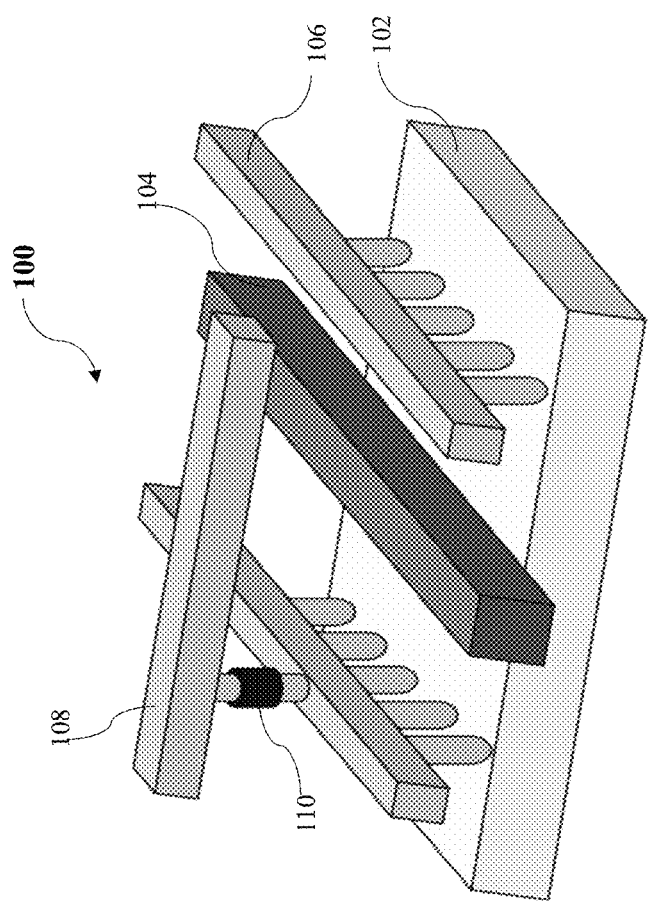

The embodiments generally relate to devices, such as semiconductor devices. More particularly, some embodiments relate to memory devices, for example, non-volatile memory devices such as ReRAMs, MRAMs and PCRAMs. The memory devices may be used to form memory cells that may be employed in memory and neuromorphic applications.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Figure 2A:
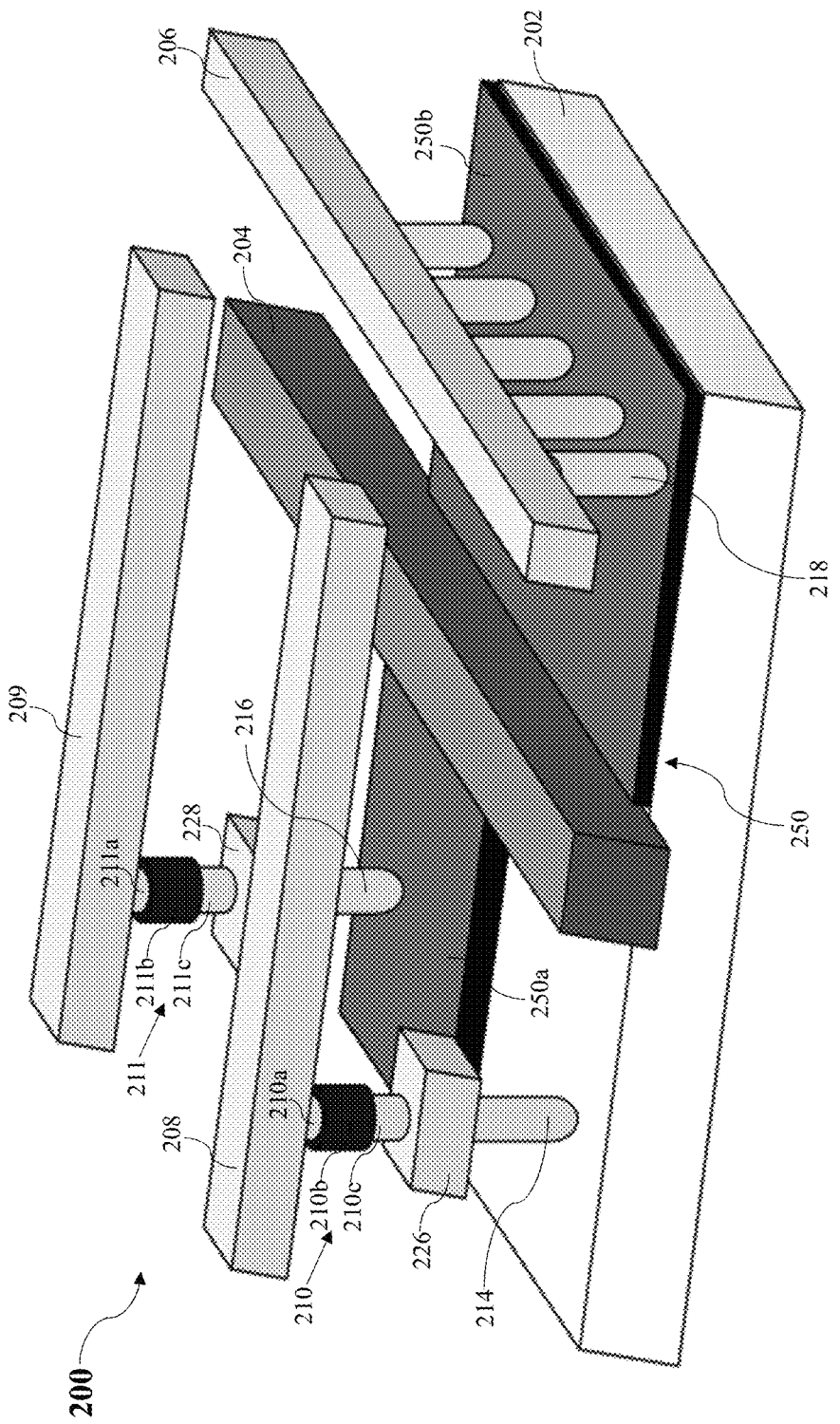
FIGS. 2A, 2B, 2C, 2D and 2E respectively show a perspective view, a top view, a first cross-sectional view, a second cross-sectional view and an equivalent circuit of a memory device according to various non-limiting embodiments.
Figure 2B:
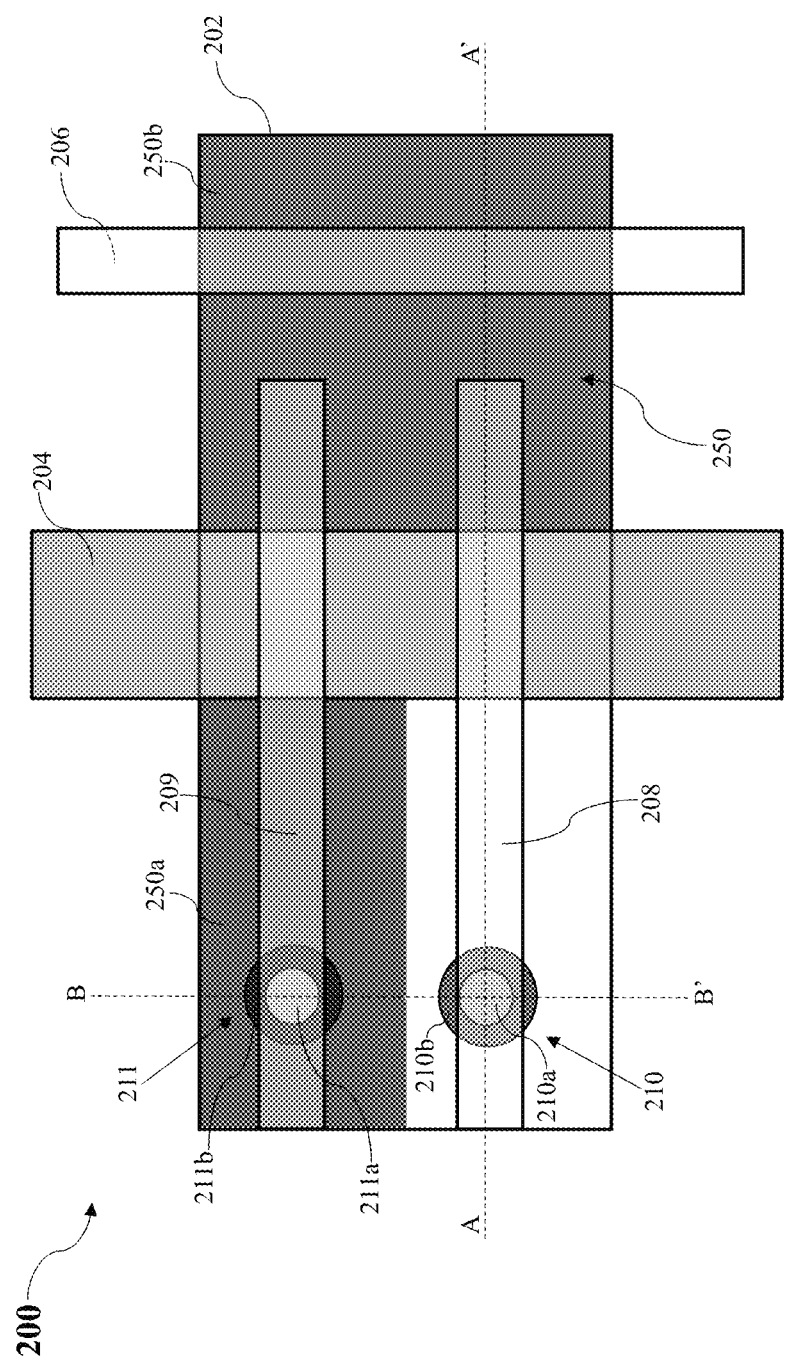
Figure 2C:
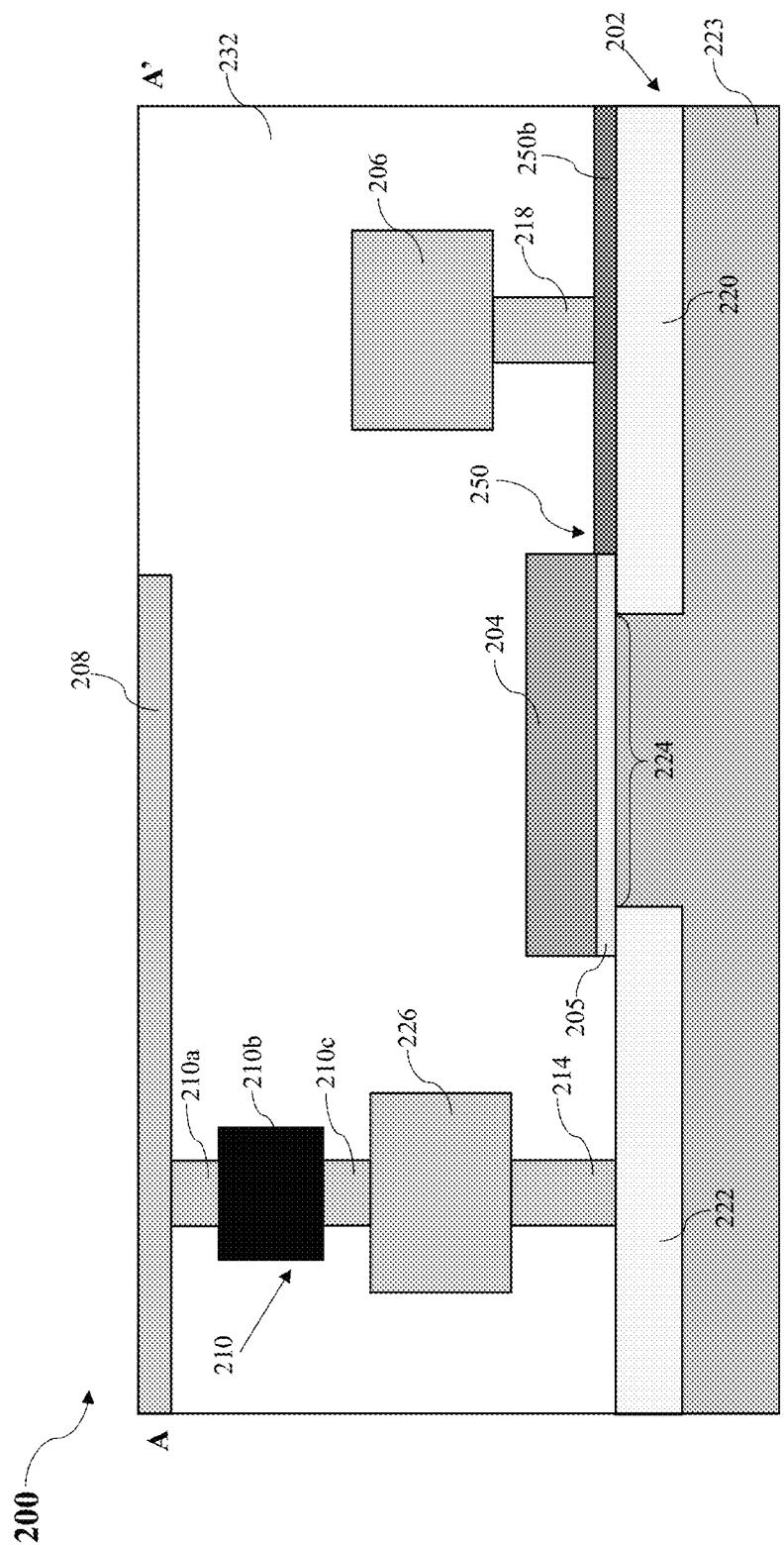
Figure 2D:
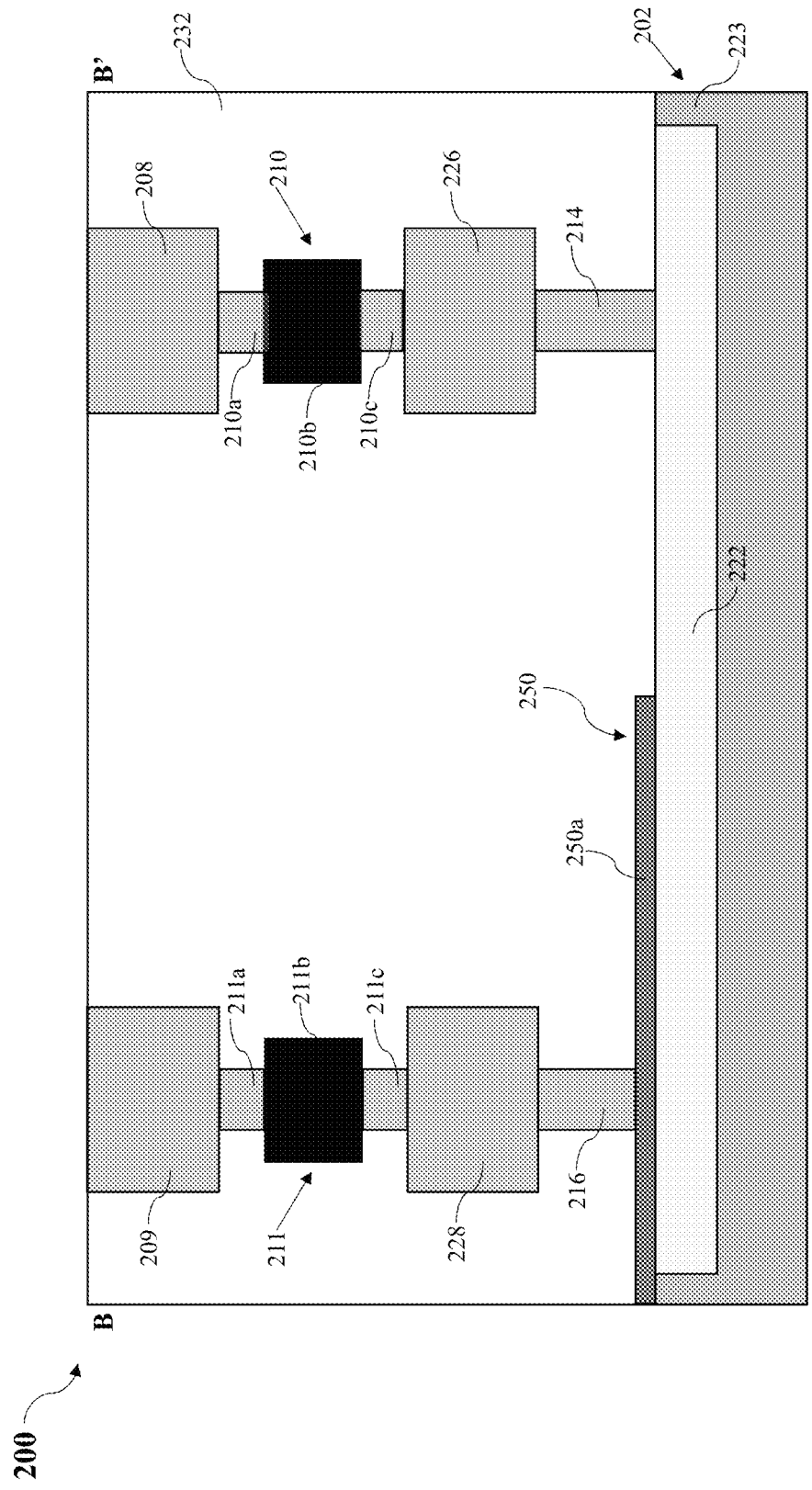
Figure 2E:
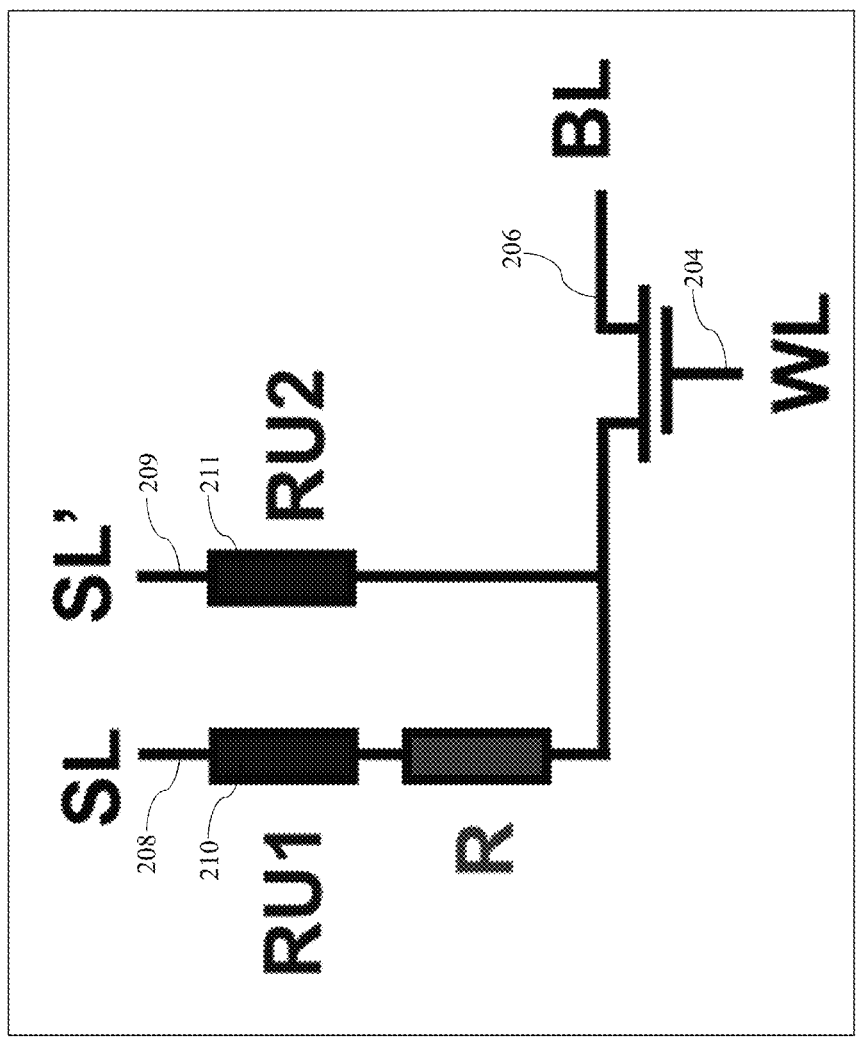

FIG. 2A shows a perspective view of a memory device 200 according to various non-limiting embodiments of the present invention. FIG. 2B shows a top view of the memory device 200, FIG. 2C shows a cross-sectional view of the memory device 200 along the line A-A' of FIG. 2B, FIG. 2D shows a cross-sectional view of the memory device 200 along the line B-B' of FIG. 2B and FIG. 2E shows an equivalent circuit of the memory device 200. In various non-limiting embodiments, the memory device 200 may be a ReRAM including a metal oxide semiconductor field effect transistor (MOSFET) and may be referred to as a multi-level cell (MLC) ReRAM.

The memory device 200 may include a substrate 202. In various non-limiting embodiments, the substrate 202 may be a bulk substrate or a silicon-on-insulation (SOI) substrate. In various non-limiting embodiments, the substrate 202 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI), silicon germanium substrates, or combinations thereof, and the like. Substrate 202 may in addition or instead include various isolations, dopings, and/or device features. The substrate 202 may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), indium antimonide (InSb), or combinations thereof; an alloy semiconductor including GaAsP, AlInAs, GaInAs, GaInP, GaInAsP, silicon germanium (SiGe), germanium tin (GeSn), silicon germanium tin (SiGeSn), or combinations thereof. Other types of materials as known to those skilled in the art may also be useful for forming the substrate 202.

Referring to FIG. 2C, the substrate 202 may include a first conductivity region 220 and a second conductivity region 222, a substrate conductivity region 223 and a channel region 224. The first conductivity region 220 and the second conductivity region 222 may be at least partially arranged within the substrate 202. The channel region 224 may be arranged within the substrate 202 between the first conductivity region 220 and the second conductivity region 222. Each of the first conductivity region 220, second conductivity region 222 and substrate conductivity region 223 may include one or more dopants. In various non-limiting embodiments, the first conductivity region 220 and second conductivity region 222 may have approximately equal doping concentrations (i.e. approximately equal concentrations of dopants). The doping concentrations of the first and second conductivity regions 220, 222 may be higher than the doping concentration of the substrate conductivity region 223. In various non-limiting embodiments, the doping concentration of the first conductivity region 220 may range from about 1e-6S/cm to about 1S/cm, the doping concentration of the second conductivity region 222 may range from about 1e-6S/cm to about 1S/cm, and the doping concentration of the substrate conductivity region 223 may range from about 1e-8S/cm to about 1e2S/cm. The first and second conductivity regions 220, 222 may have a first conductivity type. For example, the first and second conductivity regions 220, 222 may both have a p-type conductivity, in other words, include dopants having a p-type conductivity (e.g. p-type dopants). Alternatively, the first and second conductivity regions 220, 222 may both have an n-type conductivity, in other words, include dopants having an n-type conductivity (e.g. n-type dopants). In various non-limiting embodiments, the substrate conductivity region 223 may have a second conductivity type different from the first conductivity type. For example, when the first and second conductivity regions 220, 222 have a p-type conductivity, the substrate conductivity region 223 may have an n-type conductivity. Alternatively, when the first and second conductivity regions 220, 222 have an n-type conductivity, the substrate conductivity region 223 may have a p-type conductivity. In one example, the implant material for the first and second conductivity regions 220, 222 and the substrate conductivity region 223 may be the same implant material, for example, an epitaxial silicon material in various non-limiting embodiments. The p-type material may be or include, but is not limited to epitaxial silicon germanium and/or the n-type material may be or include, but is not limited to doped silicon material including n-type dopants. P-type dopants can for example, include but are not limited to boron (B), aluminium (Al), indium (In), or a combination thereof, while n-type dopants can include carbon (C), phosphorus (P), arsenic (As), antimony (Sb), or a combination thereof. Other types of implant materials and dopants as known to those skilled in the art may also be useful for forming the first and second conductivity regions 220, 222 and substrate conductivity region 223.

The memory device 200 may also include a first voltage line 204, a second voltage line 206, a third voltage line 208, and a fourth voltage line 209. The first voltage line 204 may be arranged over the channel region 224. An oxide layer 205 may be arranged between the first voltage line 204 and the substrate 202. The oxide layer 205 may include a gate oxide layer formed of any gate oxide material known in the art, such as high-k dielectrics or silicon dioxide in a non-limiting example. Each of the second voltage line 206, the third voltage line 208, and the fourth voltage line 209 may be electrically coupled to one of the conductivity regions 220, 222. For example, as shown in FIGS. 2C and 2D, the second voltage line 206 may be electrically coupled to the first conductivity region 220; whereas, the third and fourth voltage lines 208, 209 may both be electrically coupled to the second conductivity region 222. In various non-limiting embodiments, the first conductivity region 220 may include a drain region and the second conductivity region 222 may include a source region. In these non-limiting embodiments, the first voltage line 204 may include a word line (WL), the second voltage line 206 may include a bit line (BL), the third voltage line 208 may include a first source line (SL) and the fourth voltage line 209 may include a second source line (SL') as shown in the equivalent circuit of FIG. 2E. However, in alternative non-limiting embodiments, the first conductivity region 220 may include a source region and the second conductivity region 222 may include a drain region. In these alternative non-limiting embodiments, the first voltage line 204 may include a word line (WL), the second voltage line 206 may include a source line (SL), the third voltage line 208 may include a first bit line (BL) and the fourth voltage line 209 may include a second bit line (BL').

A first resistive unit 210 (RU1) may be arranged between the third voltage line 208 and the second conductivity region 222, and a second resistive unit 211 (RU2) may be arranged between the fourth voltage line 209 and the second conductivity region 222. In other words, the second conductivity region 222 may be below both the first and second resistive units 210, 211, and the first and second resistive units 210, 211 may be electrically coupled in parallel to the second conductivity region 222 (as more clearly shown by the equivalent circuit of FIG. 2E). The first resistive unit 210 may include a first top electrode 210a, a first bottom electrode 210c and a first resistive layer 210b arranged between the first top and bottom electrodes 210a, 210c. The second resistive unit 211 may include a second top electrode 211a, a second bottom electrode 211c and a second resistive layer 211b arranged between the second top and bottom electrodes 211a, 211c.

In various non-limiting embodiments, the first and second resistive units 210, 211 of the memory device 200 may be substantially identical or identical. In other words, the first and second resistive units 210, 211 may be formed substantially of the same material and may have substantially the same dimensions. Using substantially identical resistive units 210, 211 may simplify the process of forming the memory device 200 and hence, lower the costs of manufacturing this device 200. The first resistive unit 210 may have a resistance configured to switch between a lower resistance value (LRS) and a higher resistance value (HRS) in response to a change in voltage applied between the second voltage line 206 and the third voltage line 208. Similarly, the second resistive unit 211 may have a resistance configured to switch between a lower resistance value (LRS) and a higher resistance value (HRS) in response to a change in voltage applied between the second voltage line 206 and the fourth voltage line 209. In various non-limiting embodiments, the first and second resistive layers 210b, 211b may include transition metal oxide, such as, but not limited to, a tantalum oxide ($TaO_x$), titanium oxide ($TiO_x$), titanium oxy nitride (TiON), silicon oxide ($SiO_x$), aluminium oxide ($AlO_x$), niobium oxide ($NbO_x$), hafnium oxide ($HfO_x$), and combinations thereof. The first and second top electrodes 210a, 211a, and the first and second bottom electrodes 210c, 211c may be formed of platinum, iridium, tantalum, titanium nitride, alloys thereof, or combinations thereof. Other types of materials as known to those skilled in the art may also be useful for forming the first and second resistive layers 210b, 211b, the first and second top electrodes 210a, 211a, and the first and second bottom electrodes 210c, 211c.

The memory device 200 may also include a first contact 214 configured to electrically couple the first resistive unit 210 and the third voltage line 208 to the second conductivity region 222, and a second contact 216 configured to electrically couple the second resistive unit 211 and the fourth voltage line 209 to the second conductivity region 222. A first conductive element 226 may be arranged between the first resistive unit 210 and the first contact 214, and a second conductive element 228 may be arranged between the second resistive unit 211 and the second contact 216. The memory device 200 may further include a plurality of third contacts 218 configured to electrically couple the second voltage line 206 to the first conductivity region 220. Referring to FIGS. 2C and 2D, in various non-limiting embodiments, the memory device 200 may further include an insulating layer 232, such as but not limited to a silicon oxide layer. The contacts 214, 216, 218, conductive elements 226, 228, resistive units 210, 211, and voltage lines 204, 206, 208, 209 may be at least partially arranged within the insulating layer 232. For simplicity, the insulating layer 232 is not shown in FIG. 2A.

The memory device 200 may further include a resistance adjusting element 250. In various non-limiting embodiments, the resistance adjusting element 250 may have at least a portion arranged between one of the resistive units 210, 211 and one of the conductivity regions 220, 222. In various non-limiting embodiments, the at least a portion of the resistance adjusting element 250 may be arranged between one of the first and second contacts 214, 216, and one of the conductivity regions 220, 222. An amount of the resistance adjusting element 250 between the first resistive unit 210 and the second conductivity region 222 may be different from an amount of the resistance adjusting element 250 between the second resistive unit 211 and the second conductivity region 222. In various non-limiting embodiments, the resistance adjusting element 250 may have a portion between one of the resistive units 210, 211 and the second conductivity region 222, and the resistance adjusting element 250 may be absent between the other resistive unit 210, 211 and the second conductivity region 222. For example, referring to FIGS. 2A and 2B, the resistance adjusting element 250 may have a portion 250a between the second resistive unit 211 and the second conductivity region 222, and may be absent between the first resistive unit 210 and the second conductivity region 222 in a non-limiting embodiment. However, in alternative non-limiting examples, the resistance adjusting element 250 may have a portion between the first resistive unit 210 and the second conductivity region 222, and may be absent between the second resistive unit 211 and the second conductivity region 222.

Referring to FIGS. 2A and 2B, the second contact 216 may be connected to the portion 250a of the resistance adjusting element 250, which may in turn be connected to the second conductivity region 222. Thus, the fourth voltage line 209 and the second resistive unit 211 may be electrically coupled to the second conductivity region 222 via the second conductive element 228, the second contact 216, and the portion 250a of the resistance adjusting element 250. On the other hand, the third voltage line 208 and the first resistive unit 210 may be electrically coupled to the second conductivity region 222 via the first conductive element 226 and the first contact 214 without the resistance adjusting element 250. In various non-limiting embodiments, the resistance adjusting element 250 may affect the contact resistance between the second contact 216 and the second conductivity region 222. Accordingly, the resistance between the third voltage line 208 and the second conductivity region 222 may differ from the resistance between the fourth voltage line 209 and the second conductivity region 222. For example, the contact resistance between the second contact 216 and the second conductivity region 222 may be reduced by the portion 250a of the resistance adjusting element 250. Thus, the resistance between the third voltage line 208 and the second conductivity region 222 may be higher than the resistance between the fourth voltage line 209 and the second conductivity region 222. In the equivalent circuit as shown in FIG. 2E, the additional resistance between the third voltage line 208 and the second conductivity region 222 (due to an absence of the resistance adjusting element 250) may be represented by a resistor R.

The resistance adjusting element 250 may include a further portion 250b arranged between second voltage line 206 and the first conductivity region 220. This further portion 250b of the resistance adjusting element 250 may be connected to the first conductivity region 220. Each of the third contacts 218 may have one end connected to the further portion 250b of the resistance adjusting element 250 and the other end connected to the second voltage line 206. In other words, the second voltage line 206 may be electrically coupled to the first conductivity region 220 via the third contacts 218 and the resistance adjusting element 250. In various non-limiting embodiments, the further portion 250b of the resistance adjusting element 250 may reduce the contact resistance between the third contacts 218 and the first conductivity region 220, in turn reducing the resistance between the second voltage line 206 and the first conductivity region 220. In various non-limiting embodiments, the further portion 250b of the resistance adjusting element 250 may be absent.

In various non-limiting embodiments, the resistance adjusting element 250 may include silicide. For example, the resistance adjusting element 250 may include one or more silicide layers over the substrate 202 in contact with the substrate 202. In various non-limiting embodiments, the silicide may include cobalt silicide (CoSi2), nickel silicide (NiSi), titanium silicide (TiSi2), tantalum silicide (TaSi2), platinum silicide (PtSi), palladium silicide (Pd2Si), rhodium silicide (RhSi), or combinations thereof. Other silicides as known to those skilled in the art may also be included. Alternatively, the resistance adjusting element 250 may include other materials, for example, metals such as but not limited to, aluminum (Al) that can affect the resistance between the contact 214/216 and the second conductivity region 222.

In use, the memory device 200 may be switchable between four states LL(00), LH(01), HL(10) and HH(11) as shown in Table 1 below. To elaborate, the memory device 200 may be in the LL(00) state when both the resistances of the first and second resistive units 210, 211 have the lower resistance value (LRS). The memory device 200 may be in the LH(01) state when the resistances of the first and second resistive units 210, 211 have the lower resistance value (LRS) and the higher resistance value (HRS) respectively. The memory device 200 may be in the HL(10) state when the resistances of the first and second resistive units 210, 211 have the higher resistance value (HRS) and the lower resistance value (LRS) respectively. The memory device 200 may be in the HH(11) state when both the resistances of the first and second resistive units 210, 211 have the higher resistance value (HRS). In Table 1 below, R represents the additional resistance between the third voltage line 208 and the second conductivity region 222 due to an absence of the resistance adjusting element 250 between the first contact 214 and the second conductivity region 222.

TABLE 1

| State of memory device 200 | LL(00) | LH(01) | HL(10) | HH(11) |
|---|---|---|---|---|
| Resistance of the first resistive unit 210 | LRS | LRS | HRS | HRS |
| Resistance between the third voltage line 208 and the second conductivity region 222 | LRS + R | LRS + R | HRS + R | HRS + R |
| Resistance of the second resistive unit 211 | LRS | HRS | LRS | HRS |
| Resistance between the fourth voltage line 209 and the second conductivity region 222 | LRS | HRS | LRS | HRS |

A change in voltage may be applied between the second voltage line 206 and the third voltage line 208 to switch the resistance of the first resistive unit 210 between the lower resistance value (LRS) and the higher resistance value (HRS). Similarly, a change in voltage may be applied between the second voltage line 206 and the fourth voltage line 209 to switch the resistance of the second resistive unit 211 between the lower resistance value (LRS) and the higher resistance value (HRS). In various non-limiting embodiments as shown in Table 2 below, a voltage at the first voltage line 204 may be kept constant at 2.5V, a voltage at the second voltage line 206 may be kept constant at 0V (in other words, the second voltage line 206 may be grounded) and the resistances of the first and second resistive units 210, 211 may be changed by changing only the voltage applied to the third voltage line 208 or the voltage applied to the fourth voltage line 209.

For example, to switch the resistance of the first resistive unit 210 from the higher resistance value (HRS) to the lower resistance value (LRS) indicated as "Set 1" in Table 2, a voltage of 2.5V may be applied to the third voltage line 208 while the fourth voltage line 209 is floating. To switch the resistance of the second resistive unit 211 from the higher resistance value (HRS) to the lower resistance value (LRS) indicated as "Set 2" in Table 2, a voltage of 2.5V may be applied to the fourth voltage line 209 while the third voltage line 208 is floating. To switch the resistance of the first resistive unit 210 from the lower resistance value (LRS) to the higher resistance value (HRS) indicated as "Reset 1" in Table 2, a voltage of 1.25V may be applied to the third voltage line 208 while the fourth voltage line 209 is floating. To switch the resistance of the second resistive unit 211 from the lower resistance value (LRS) to the higher resistance value (HRS) indicated as "Reset 2" in Table 2, a voltage of 1.25V may be applied to the fourth voltage line 209 while the third voltage line 208 is floating. However, in alternative non-limiting embodiments, the memory device 200 may be switched between the four states LL(00), LH(01), HL(10) and HH(11) by changing not only the voltage applied to the third voltage line 208 or the voltage applied to the fourth voltage line 209, but also the voltage applied to the second voltage line 206. Further, in various alternative non-limiting embodiments, other voltages may be applied to the voltage lines to switch the memory device 200 between the four states LL(00), LH(01), HL(10) and HH(11). As shown in Table 2, in various non-limiting embodiments, to read the memory device 200, a voltage of $V_{DD}$ may be applied to the first voltage line 204, a voltage of 0.1V may be applied to the second voltage line 206 and a voltage of 0V may be applied to both the third and fourth voltage lines 208, 209. However, other voltages may be applied to read the memory device 200 in other non-limiting embodiments.

TABLE 2

|  | Set_1 | Set_2 | Reset_1 | Reset_2 | Read |
|---|---|---|---|---|---|
| Voltage at first voltage line 204 |  | 2.5 V |  |  | $V_{DD}$ |
| Voltage at second voltage line 206 |  | 0 V |  |  | 0.1 V |
| Voltage at third voltage line 208 | 2.5 V | Float | 1.25 V | Float | 0 V |
| Voltage at fourth voltage line 209 | Float | 2.5 V | Float | 1.25 V | 0 V |
| Change in resistance of the first resistive unit 210 | HRS to LRS | No change | LRS to HRS | No change | No change |

TABLE 2-continued

|  | Set_1 | Set_2 | Reset_1 | Reset_2 | Read |
|---|---|---|---|---|---|
| Change in resistance of the second resistive unit 211 | No change | HRS to LRS | No change | LRS to HRS | No change |

Referring to Tables 1 and 2, in various non-limiting embodiments, the memory device 200 may thus be switched between the four states LL(00), LH(01), HL(10) and HH(11) by changing the voltages applied to the third and fourth voltage lines 208, 209. For example, to switch the memory device 200 from the LL(00) state to the LH(01) state, a voltage of 1.25V may be applied to the fourth voltage line 209 while the third voltage line 208 is floating to change the resistance of the second resistive unit 211 from the lower resistance value (LRS) to the higher resistance value (HRS). In another non-limiting example, to switch the memory device 200 from the LL(00) state to the HH(11) state, the resistance of the first resistive unit 210 may first be changed from the lower resistance value (LRS) to the higher resistance value (HRS) and subsequently, the resistance of the second resistive unit 211 may then be changed from the lower resistance value (LRS) to the higher resistance value (HRS).

Figure 3:
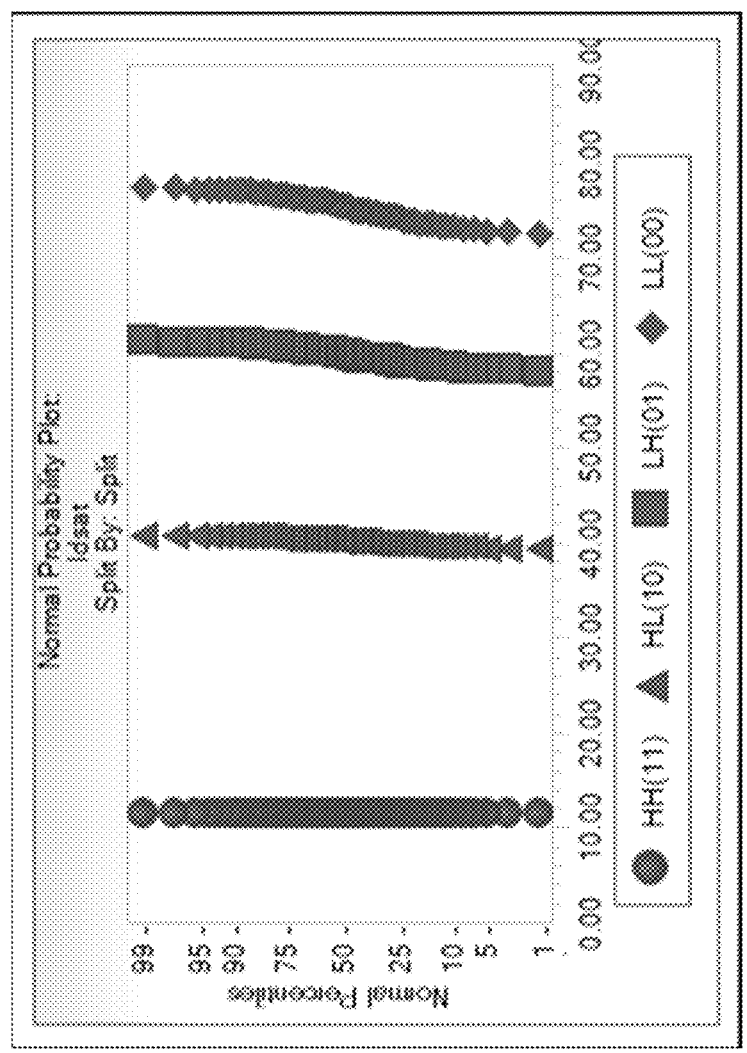
FIG. 3 shows a normal probability plot of the read current of the memory device of FIGS. 2A to 2E.

FIG. 3 shows the normal probability plot of the read current (Iread) for the memory device 200. The read current (Iread) may correspond to the resistance (Res) between the voltage line 208/209 and the conductivity region 222 through which the read current (Iread) flows since this resistance (Res) may be expressed in the form of the following equation: Vdd/Iread=Res. The normal probability plot of FIG. 3 is obtained via Monte Carlo simulation of the memory device 200. As shown in FIG. 3, the memory device 200 is switchable between four states LL(00), LH(01), HL(10) and HH(11) with a sufficiently wide cell window (said differently, the spacing between each state and its adjacent states is sufficiently wide). In various non-limiting embodiments, the cell window may be larger when the first conductivity region 220 is a drain region and the second conductivity region 222 is a source region, than when the first conductivity region 220 is a source region and the second conductivity region 222 is a drain region.

FIGS. 4A to 4F show perspective views that illustrate a method for fabricating the memory device 200 according to various non-limiting embodiments of the present invention.

Referring to FIG. 4A, according to various non-limiting embodiments, a method for fabricating the memory device 200 may begin by providing the substrate 202, forming the oxide layer 205 over the substrate 202, forming the first voltage line 204 over the substrate 202 with the oxide layer 205 between the first voltage line 204 and the substrate 202, and forming the first conductivity region 220 and the second conductivity region 222 at least partially within the substrate 202. In a non-limiting embodiment, first voltage line 204, and the first and second conductivity regions 220, 222 may be formed using a conventional front end of line (FEOL) process as known to those skilled in the art. However, other techniques as known to those skilled in the art may also be useful for forming the first voltage line 204 and the first and second conductivity regions 220, 222.

Referring to FIG. 4B, in various non-limiting embodiments, the method may further include forming the resistance adjusting element 250 over at least a portion of the substrate 202. In various non-limiting embodiments, the method may form the resistance adjusting element 250 by selective silicidation of the portion of the substrate 202. For example, an asymmetrical silicide layer may be formed over the substrate 202 by siliciding the top surface of the substrate 202, except for the portion under the first voltage line 204 and except for a portion under where the first resistive unit 210 is to be formed. The silicidation of the substrate 202 may be performed by for example, depositing a metal over the portion(s) of the substrate where the silicide is to be formed and providing energy (e.g. by thermal heating, laser irradiation or ion beam mixing) to the metal-silicon interface between the deposited metal and the silicon substrate 202. Providing the energy to the metal-silicon interface may cause the metal to react with the silicon to form silicide. Any unreacted metal may then be removed by processes known to those skilled in the art. However, other processes as known to those skilled in the art may also be used to form the resistance adjusting element 250.

Referring to FIG. 4C, the method may further include forming the first contact 214 over the substrate 202 with the first contact 214 connected to the second conductivity region 222, forming the second contact 216 over the substrate 202 with the second contact 216 connected to the portion 250a of the resistance adjusting element 250, and forming the third contacts 218 over the substrate 202 with the third contacts 218 connected to the further portion 250b of the resistance adjusting element 250. The first, second and third contacts 214, 216, 218 may be formed by depositing first insulating material/layer (such as, but not limited to, a silicon oxide layer) over the substrate 202, etching the first insulating material/layer to form first, second and third contact holes for the first, second and third contacts 214, 216, 218 respectively in the first insulating material/layer (using for example, photoresist masks) and filling the contact holes with conductive material such as, but not limited to, tungsten, silver, copper, gold, aluminium, alloys thereof or combinations thereof as known to those skilled in the art.

Referring to FIG. 4D, the method may further include forming the first conductive element 226 over the first contact 214, forming the second conductive element 228 over the second contact 216 and forming the second voltage line 206 over the third contacts 218. The first and second conductive elements 226, 228 and the second voltage line 206 may be formed by depositing second insulating material/layer (such as, but not limited to, a silicon oxide layer) over the first insulating material/layer, etching the second insulating material/layer to form openings for the conductive elements 226, 228 and the second voltage line 206 (using for example, photoresist masks) and filling the openings with conductive material (such as, but not limited to, tungsten, silver, copper, gold, aluminium, alloys thereof or combinations thereof) as known to those skilled in the art.

Referring to FIG. 4E, the method may further include forming the first and second resistive units 210, 211 over the respective conductive elements 226, 228. In various non-limiting embodiments, the first resistive unit 210 and the second resistive unit 211 may be formed simultaneously. Forming the first resistive unit 210 and the second resistive unit 211 simultaneously may help to simplify the fabrication of the memory device 200 and reduce manufacturing costs. For example, a first conductive material may be deposited over the conductive elements 226, 228. A mask protecting regions of the first conductive material intended for the first and second resistive units 210, 211 (such as, but not limited to, a photoresist mask arranged over the first conductive material and having openings exposing portions of the first conductive material not intended for the resistive units 210, 211) may be formed over the first conductive material and exposed portions of the first conductive material may be etched. An oxidation step may be performed to oxidise part of the remaining regions of the first conductive material to form the first and second resistive layers 210b, 211b, and the first and second bottom electrodes 210c, 211c. A second conductive material may be formed over the oxidised regions of the first conductive material, and etched using another mask to form the first and second top electrodes 210a, 211a. However, other techniques as known to those skilled in the art may also be useful for forming the first and second resistive units 210, 211. Further, the first and second resistive units 210, 211 need not be formed simultaneously and in other non-limiting embodiments, either the first resistive unit 210 may be formed before the second resistive unit 211 or the second resistive unit 211 may be formed before the first resistive unit 210.

Referring to FIG. 4F, the method may further include forming the third voltage line 208 over the first resistive unit 210 and the fourth voltage line 209 over the second resistive unit 211. In various non-limiting embodiments, the third and fourth voltage lines 208, 209 may be formed simultaneously. Forming the third and fourth voltage lines 208, 209 simultaneously may help to simplify the fabrication process of the memory device 200 and reduce manufacturing costs. For example, a third insulating material/layer (such as, but not limited to, a silicon oxide layer) may be deposited over the second insulating material/layer and etched using a mask to form openings for the third and fourth voltage lines 208, 209, and the openings may be filled with conductive material (such as, but not limited to, tungsten, silver, copper, gold, aluminium, alloys thereof or combinations thereof) to form the third and fourth voltage lines 208, 209. However, other techniques as known to those skilled in the art may also be useful for forming the third and fourth voltage lines 208, 209. Further, the third and fourth voltage lines 208, 209 need not be formed simultaneously and in other non-limiting embodiments, either the third voltage line 208 may be formed before the fourth voltage line 209, or the fourth voltage line 209 may be formed before the third voltage line 208. The first, second and third insulating material/layers may, in combination, form the insulating layer 232 shown in FIGS. 2C and 2D.

Although not shown in the figures, the method may further include forming further contacts and conductive lines, and a passivation layer to protect the memory device 200. The further contacts, conductive lines and passivation layer may be formed using a conventional BEOL process as known to those skilled in the art but other techniques as known to those skilled in the art may also be useful.

The above described order of the steps for the method is only intended to be illustrative, and the steps of the method of the present invention are not limited to the above specifically described order unless otherwise specifically stated.

Figure 5:
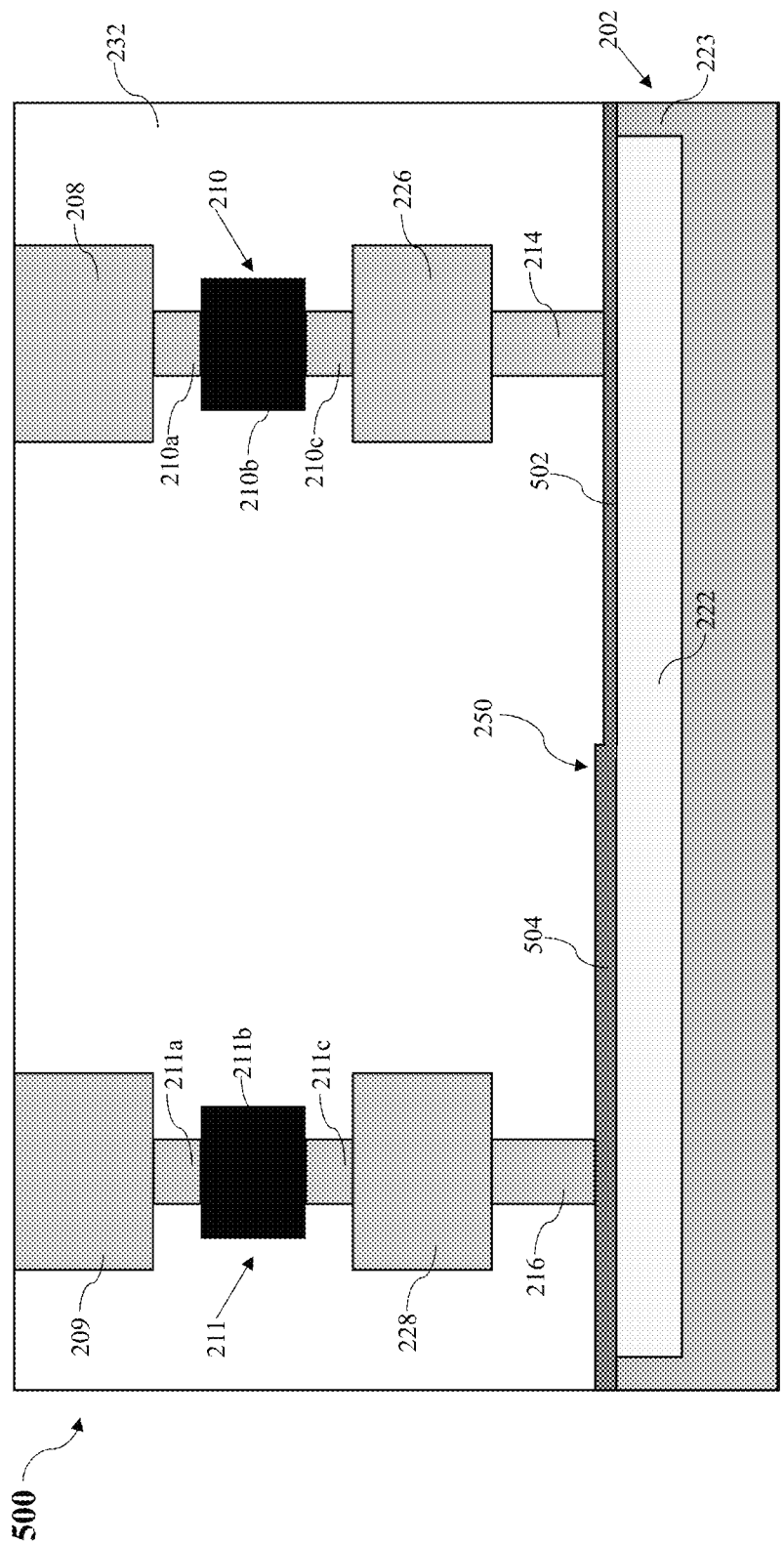
FIG. 5 shows a cross-sectional view of a memory device according to alternative non-limiting embodiments.

FIG. 5 shows a cross-sectional view of a memory device 500 according to alternative non-limiting embodiments of the present invention. Memory device 500 is similar to memory device 200, and thus the common features are labelled with the same reference numerals and need not be discussed. As shown in FIG. 5, the memory device 500 may also include a resistance adjusting element 250 over the substrate 202. However, the resistance adjusting element 250 may have a first portion 502 between the first resistive unit 210 and the second conductivity region 222, and a second portion 504 between the second resistive unit 211 and the second conductivity region 222. A thickness of the first portion 502 of the resistance adjusting element 250 may be different from a thickness of the second portion 504 of the resistance adjusting element 250. For example, as shown in FIG. 5, the first portion 502 of the resistance adjusting element 250 may be thinner than the second portion 504. In various non-limiting embodiments, the resistance adjusting element 250 may reduce the contact resistance between the contacts 214, 216 and the second conductivity region 222. Accordingly, the resistance between the third voltage line 208 (over the thinner first portion 502) and the second conductivity region 222 may be higher than the resistance between the fourth voltage line 209 (over the thicker second portion 504) and the second conductivity region 222. However, the first portion 502 of the resistance adjusting element 250 need not be thinner than the second portion 504. In alternative non-limiting examples, the second portion 504 may be thinner than the first portion 502.

The method of forming the memory device 500 may be similar to the method of forming the memory device 200, except that when siliciding the top surface of the substrate 202, the portion under where the first resistive unit 210 is to be formed may also be silicided. However, this portion may be thinner than the portion under where the second resistive unit 211 is to be formed.

Figure 6:
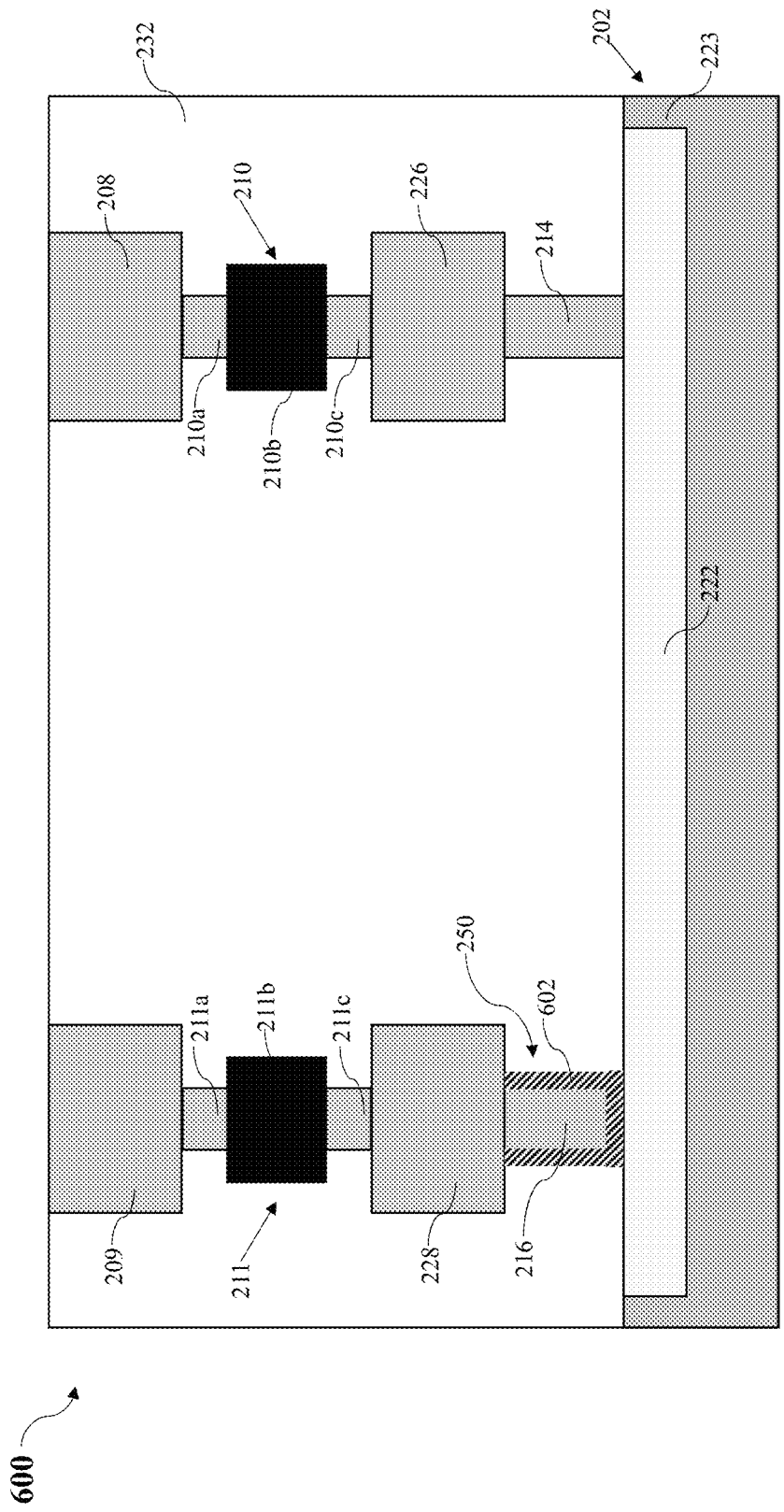
FIG. 6 shows a cross-sectional view of a memory device according to alternative non-limiting embodiments.

In alternative non-limiting embodiments, the resistance adjusting element 250 may further or alternatively include a liner lining a surface of one or both of the first and second contacts 214, 216. The resistance between the one or both of the first and second contacts 214, 216 and the conductivity region (e.g. conductivity region 222) below the one or both of the first and second contacts 214, 216 may be decreased by the liner. FIG. 6 shows a cross-sectional view of a memory device 600 according to various alternative non-limiting embodiments of the present invention. Memory device 600 is similar to memory device 200, and thus the common features are labelled with the same reference numerals and need not be discussed. As shown in FIG. 6, the resistance adjusting element 250 may alternatively include a liner 602, where the liner 602 may be arranged between the second resistive unit 211 and the second conductivity region 222 and may be absent between the first resistive unit 210 and the second conductivity region 222. For example, the liner 602 may be arranged to line a surface of the second contact 216. This may lower the contact resistance between the second contact 216 and the substrate 202. Accordingly, the resistance between the third voltage line 208 and the second conductivity region 222 may be higher than the resistance between the fourth voltage line 209 and the second conductivity region 222. However, in alternative non-limiting embodiments, the liner 602 may be arranged between the first resistive unit 210 and the second conductivity region 222 (e.g. may be arranged to line a surface of the first contact 214), and may be absent between the second resistive unit 211 and the second conductivity region 222.

Figure 7:
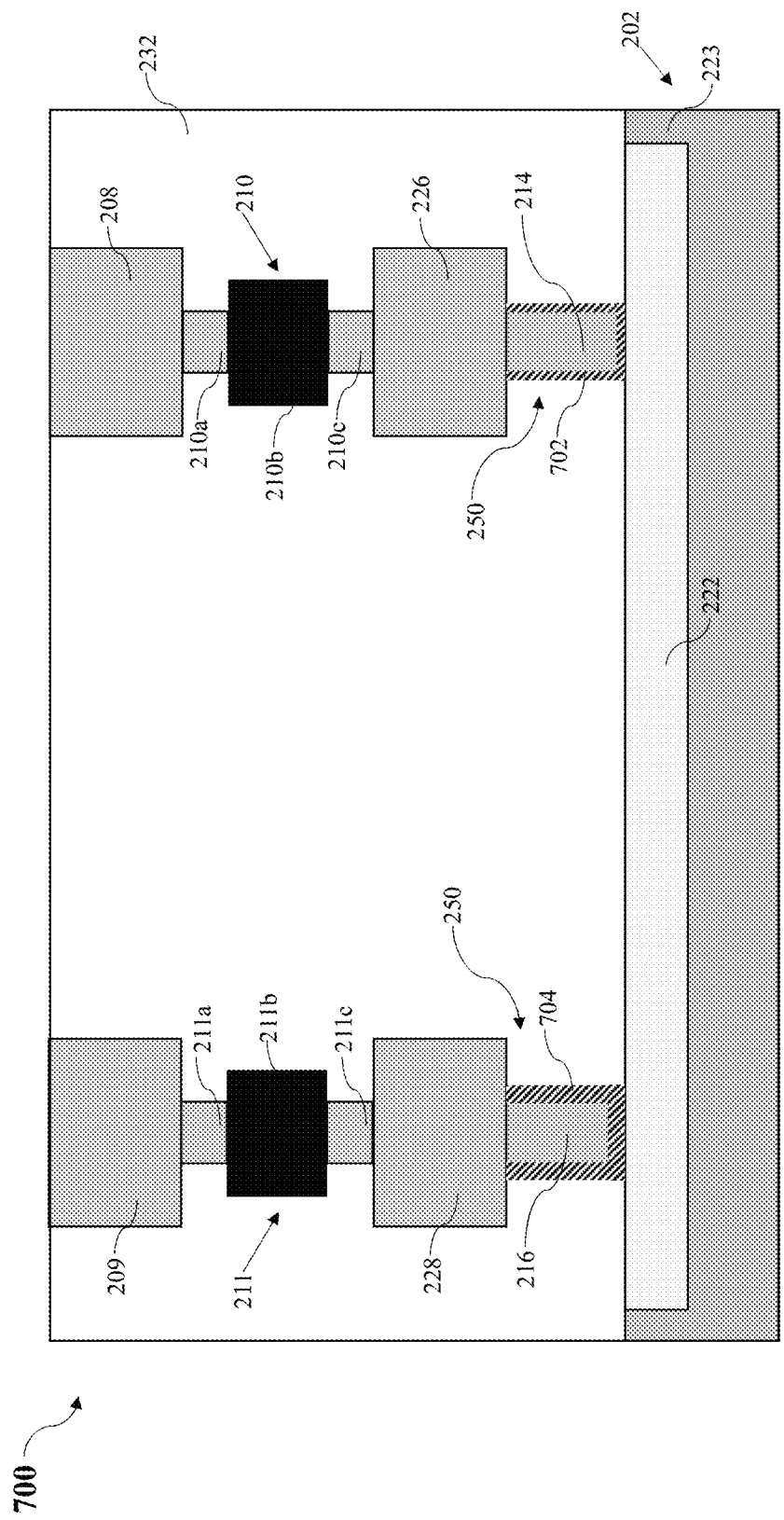
FIG. 7 shows a cross-sectional view of a memory device according to alternative non-limiting embodiments.

FIG. 7 shows a cross-sectional view of a memory device 700 according to various alternative non-limiting embodiments of the present invention. Memory device 700 is similar to memory device 200, and thus the common features are labelled with the same reference numerals and need not be discussed. As shown in FIG. 7, the resistance adjusting element 250 may alternatively include a first liner 702 between the first resistive unit 210 and the second conductivity region 222, and a second liner 704 between the second resistive unit 211 and the second conductivity region 222. A thickness of the first liner 702 may be different from a thickness of the second liner 704. For example, as shown in FIG. 7, the second liner 704 may be thicker than the first liner 702. The resistance between the third voltage line 208 and the second conductivity region 222 may thus be higher than the resistance between the fourth voltage line 209 and the second conductivity region 222. However, in alternative non-limiting examples, the first liner 702 may be thicker than the second liner 704.

In various non-limiting embodiments, the memory device 200, 500 may further include a resistance adjusting element 250 including a liner similar to that in either the memory device 600, the memory device 700 or the alternative non-limiting examples similar to these memory devices 600, 700 as described above. The method of forming the memory devices 600, 700 may be similar to the method of forming the memory device 200, except that after forming the first and second contact holes for the first and second contacts 214, 216 in the first insulating material/layer, the resistance adjusting element 250 may be formed by forming a liner lining in at least one of the first and second contact holes prior to filling the contact holes with conductive material. For example, the liner may be formed in only the second contact hole for the second contact 216 to form the memory device 600. Alternatively, the first liner 702 may be formed in the first contact hole and the second liner 704 with a thickness different from that of the first liner 702 may be formed in the second contact hole to form the memory device 700. In various non-limiting embodiments, the liner may include titanium (Ti), titanium nitride (TiN), tantalum (Ta), tantalum nitride (TaNi), or combinations thereof. However, other materials as known to those skilled in the art may also be included.

Figure 8A:
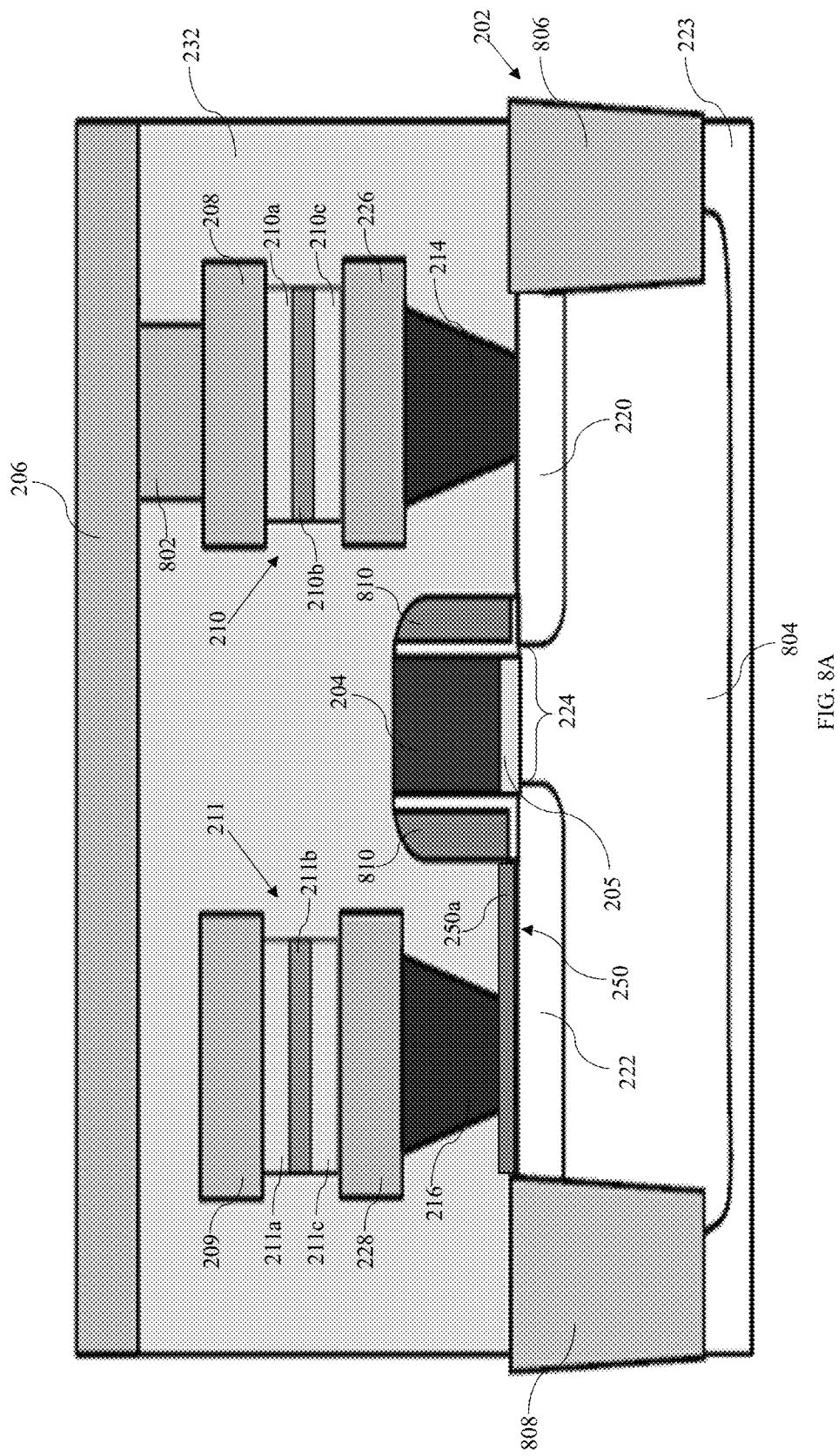
FIGS. 8A and 8B respectively show a cross-sectional view and an equivalent circuit of a memory device according to alternative non-limiting embodiments.
Figure 8B:
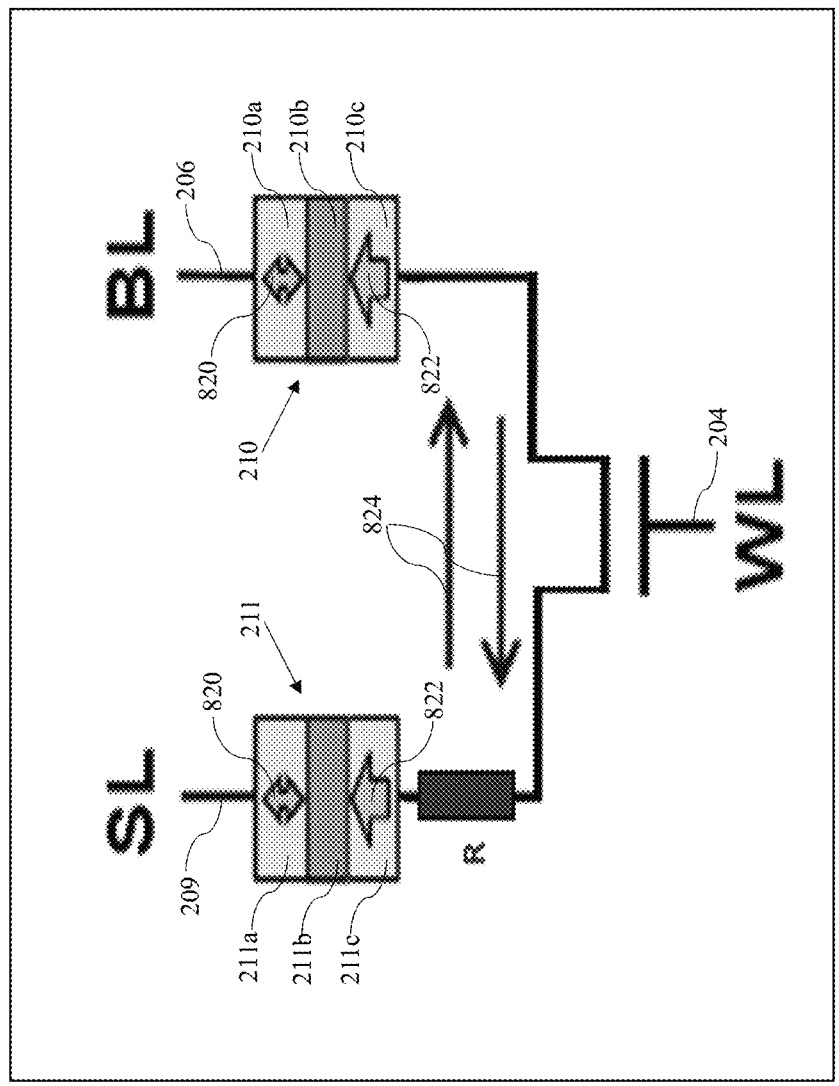

FIG. 8A shows a cross-sectional view of a memory device 800 according to alternative non-limiting embodiments, and FIG. 8B shows an equivalent circuit of the memory device 800. Memory device 800 is similar to memory device 200, and thus the common features are labelled with the same reference numerals and need not be discussed. In various non-limiting embodiments, the memory device 800 may be a MRAM and the resistive units 210, 211 may include magnetic tunnel junctions. For example, referring to FIG. 8A, the resistive units 210, 211 may include oxide barriers 210$b$, 211$b$ sandwiched between top and bottom electrodes 210$a$, 211$a$, 210$c$, 211$c$. The thin oxide barriers 210$b$, 211$b$ may include oxide such as, but not limited to, magnesium oxide (MgO) or aluminum oxide ($Al_2O_3$). The top electrodes 210$a$, 211$a$ may be ferromagnetic free layers (with magnetization free to rotate as indicated by the arrows 820 in FIG. 8B) and the bottom electrodes 210$c$, 211$c$ may be ferromagnetic fixed layers (with magnetization fixed in a particular direction as indicated by the arrows 822 in FIG. 8B). The memory device 800 may also include first, second, third and fourth voltage lines 204, 206, 208, 209. Changing the voltages applied to these voltage lines 204, 206, 208, 209 may change the current through the resistive units 210, 211 and change the magnetization direction of the top electrodes 210$a$, 211$a$ (free layers). The orientation of the magnetization of the top electrodes 210$a$, 211$a$ (free layers) relative to that of the bottom electrodes 210$c$, 211$c$ (fixed layers) may thus be changed, in turn changing the resistance of the resistive units 210, 211.

As shown in FIG. 8A, the first voltage line 204 may (similar to the memory device 200) be arranged over the channel region 224 and between spacers 810. The fourth voltage line 209 may (similar to the memory device 200) be electrically coupled to the second conductivity region 222. However, unlike the memory device 200, the third voltage line 208 may be electrically coupled to the first conductivity region 220. The second voltage line 206 may be arranged over the third voltage line 208, electrically coupled to the third voltage line 208 via a further contact 802. In other words, both the second and third voltage lines 206, 208 may be electrically coupled to the first conductivity region 220, and the resistive units 210, 211 may be electrically coupled in series (as shown in the equivalent circuit in FIG. 8B, for example by the arrows 824 indicating the current flow). In addition, the substrate 202 of the memory device 800 may further include a well region 804, and the first and second conductivity regions 220, 222 may be at least partially arranged in the well region 804. Further, the memory device 800 may include a first isolation region 806 and a second isolation region 808. The isolation regions 806, 808 may include shallow trench isolation (STI) regions. The conductivity regions 220, 222 and the channel region 224 may be arranged between the isolation regions 806, 808.

In various non-limiting embodiments, the first conductivity region 220 may be a drain region and the second conductivity region 222 may be a source region. In these non-limiting embodiments, the second voltage line 206 may be a bit line and the fourth voltage line 209 may be a source line (as shown in the equivalent circuit in FIG. 8B). Alternatively, the first conductivity region 220 may be a source region and the second conductivity region 222 may be a drain region, the second voltage line 206 may be a source line and the fourth voltage line 209 may be a bit line. As shown in FIG. 8A, an amount of the resistance adjusting element 250 between the first resistive unit 210 and the first conductivity region 222 may be different from an amount of the resistance adjusting element 250 between the second resistive unit 211 and the second conductivity region 222. For example, the resistance adjusting element 250 may have a portion 250$a$ between the second resistive unit 211 and the second conductivity region 222 below the second resistive unit 211 and may be absent between the first resistive unit 210 and the first conductivity region 220 below the first resistive unit 210. The resistance adjusting element 250 may affect (e.g. may decrease) the resistance between the fourth voltage line 209 and the second conductivity region 222. Accordingly, the resistance between the third voltage line 208 and the first conductivity region 220 may be different (e.g. may be higher) as compared to the resistance between the fourth voltage line 209 and the second conductivity region 222. In various alternative non-limiting embodiments, the resistance adjusting element 250 may instead include a portion between the first resistive unit 210 and the first conductivity region 220 and may be absent between the second resistive unit 211 and the second conductivity region 222. In various alternative non-limiting embodiments, the resistance adjusting element 250 may instead be similar to the resistance adjusting element 250 of the memory device 500. In various alternative non-limiting embodiments, the resistance adjusting element 250 may further or instead include a liner, similar to the resistance adjusting element 250 of either the memory device 600 or the memory device 700.

In various non-limiting embodiments, the memory device 200/500/600/700/800 which may be capable of storing more than one bit of information (as it may be switchable between more than two states) can be fabricated at a negligible additional processing cost and with a same footprint or negligible increase in footprint as compared to a prior art memory device capable of storing only one bit of information. In various alternative non-limiting embodiments, the memory device 200/500/600/700/800 may include more than two resistive units. For example, the memory device 200/500/600/700/800 may include not only the first resistive unit 210 and the second resistive unit 211, but also further resistive units that may be arranged between further voltage lines and one of the conductivity regions 220, 222. Each further resistive unit may have a resistance switchable between a lower resistance value and a higher resistance value. An amount of the resistance adjusting element 250 between each resistive unit and the conductivity region below the resistive unit may be different from an amount of the resistance adjusting element 250 between another resistive unit and the conductivity region below this other resistive unit. A memory device 200/500/600/700/800 with a number of resistive units greater than two may thus be switchable between more than four states. In various non-limiting embodiments, a memory device 200/500/600/700/800 with a number of resistive units equal to N may be switchable between $2^N$ states and the memory device may be read by identifying the state the memory device 200/500/600/700/800 is in.

In various non-limiting embodiments, the resistive units 210, 211 of the memory device 200/500/600/700 may instead include magnetic tunnel junctions and the memory device 200/500/600/700 may be a MRAM instead of a ReRAM. In various non-limiting embodiments, the resistive units 210, 211 of the memory device 800 may instead include dielectric layers sandwiched between two electrodes and the memory device 800 may be a ReRAM instead of a MRAM. In various non-limiting embodiments, the resistive units 210, 211 of the memory device 200/500/600/700/800 may instead include phase-change materials sandwiched between top and bottom electrodes, and the memory device 200/500/600/700/800 may be a PCRAM. The resistance of the phase-change materials may be switched between a higher resistance value (HRS) and a lower resistance value (LRS) by applying appropriate voltage differences between the top and bottom electrodes 210a, 211a, 210c, 211c. For example, the phase-change materials may switch between two structural phases in response to different voltage differences between the top and bottom electrodes 210a, 211a, 210c, 211c. These structural phases may include, for example a crystalline phase (in which the phase-change material may have a lower resistance) and an amorphous phase (in which the phase-change material may have a higher resistance). In various non-limiting embodiments, the phase-change materials may include materials such as, but not limited to, germanium-antimony-tellurium alloys e.g. germanium telluride (GeTe), germanium antimony telluride (GeSbTe). In yet alternative non-limiting embodiments, the memory device 200/500/600/700/800 may be any resistive-based non-volatile memory where the resistances of the resistive units 210, 211 may be switched by applying appropriate voltages to the various voltage lines 206, 208, 209.

In various non-limiting embodiments, a memory cell including a plurality of memory devices (where each memory device may, for example, be memory device 200, 500, 600, 700 or 800) may be provided. For each memory device 200/500/600/700/800 in the memory cell, either the first conductivity region 220 may include a drain region and the second conductivity region 222 may include a source region, or the first conductivity region 220 may include a source region and the second conductivity region 222 may include a drain region. In the memory cell, the memory devices 200/500/600/700/800 may be arranged in a plurality of columns and rows, and may share common voltage lines 204, 206, 208, 209. In various non-limiting embodiments, the memory cell may include one or more of ReRAMs, MRAMs and PCRAMs, each having the structure as shown in FIGS. 2A to 2D, the structure as shown in FIG. 5, the structure as shown in FIG. 6, the structure as shown in FIG. 7 or the structure as shown in FIG. 8.

The following examples pertain to further embodiments.

Example 1 may be a memory device including: a substrate that may include a first conductivity region and a second conductivity region at least partially arranged within the substrate, and a channel region arranged between the first conductivity region and the second conductivity region; a first voltage line arranged over the channel region; a second voltage line electrically coupled to the first conductivity region; a third voltage line electrically coupled to one of the conductivity regions; and a fourth voltage line electrically coupled to one of the conductivity regions; a first resistive unit arranged between the third voltage line and the conductivity region to which the third voltage line is electrically coupled, and a second resistive unit arranged between the fourth voltage line and the conductivity region to which the fourth voltage line is electrically coupled; a resistance adjusting element having at least a portion arranged between one of the resistive units and one of the conductivity regions. An amount of the resistance adjusting element between the first resistive unit and the conductivity region to which the third voltage line is electrically coupled may be different from an amount of the resistance adjusting element between the second resistive unit and the conductivity region to which the fourth voltage line is electrically coupled. The resistance between the third voltage line and the conductivity region to which the third voltage line is electrically coupled may differ from the resistance between the fourth voltage line and the conductivity region to which the fourth voltage line is electrically coupled.

In Example 2, the subject matter of Example 1 may optionally include that the memory device may further include a first contact configured to electrically couple the first resistive unit to the conductivity region to which the third voltage line is electrically coupled; and a second contact configured to electrically couple the second resistive unit to the conductivity region to which the fourth voltage line is electrically coupled. The at least a portion of the resistance adjusting element may be arranged between one of the first contact and the second contact and one of the conductivity regions.

In Example 3, the subject matter of Example 1 or Example 2 may optionally include that the resistance adjusting element has a portion between one of the resistive units and the conductivity region below the resistive unit, and the resistance adjusting element is absent between the other resistive unit and the conductivity region below the other resistive unit.

In Example 4, the subject matter of Example 1 or Example 2 may optionally include that the resistance adjusting element has a first portion between the first resistive unit and the conductivity region to which the third voltage line is electrically coupled, and a second portion between the second resistive unit and the conductivity region to which the fourth voltage line is electrically coupled, and a thickness of the first portion is different from a thickness of the second portion.

In Example 5, the subject matter of any one of Examples 1 to 4 may optionally include that the resistance adjusting element may include silicide.

In Example 6, the subject matter of Example 5 may optionally include that the resistance adjusting element may include one or more silicide layers over the substrate in contact with the substrate.

In Example 7, the subject matter of Example 2 may optionally include that the resistance adjusting element may include a liner lining a surface of one or both of the first contact and the second contact. The resistance between the one or both of the first contact and the second contact, and the conductivity region below the one or both of the first contact and the second contact may be decreased by the liner.

In Example 8, the subject matter of Example 7 may optionally include that the liner is arranged between one of the resistive units and the conductivity region below the resistive unit; and the liner is absent between the other resistive unit and the conductivity region below the other resistive unit.

In Example 9, the subject matter of Example 7 may optionally include that the resistance adjusting element may include a first liner between the first resistive unit and the conductivity region to which the third voltage line is electrically coupled; and a second liner between the second resistive unit and the conductivity region to which the fourth voltage line is electrically coupled. A thickness of the first liner may be different from a thickness of the second liner.

In Example 10, the subject matter of any one of Examples 1 to 9 may optionally include that the first and second resistive units are identical.

In Example 11, the subject matter of any one of Examples 1 to 10 may optionally include that the third voltage line and the fourth voltage line are electrically coupled to the second conductivity region.

In Example 12, the subject matter of any one of Examples 1 to 10 may optionally include that the third voltage line is electrically coupled to the first conductivity region, the fourth voltage line is electrically coupled to the second conductivity region, and the second voltage line is electrically coupled to the third voltage line.

Example 13 may be a method including: providing a substrate including a first conductivity region and a second conductivity region at least partially within the substrate, wherein a channel region is arranged between the first conductivity region and the second conductivity region, and wherein a first voltage line is formed over the channel region of the substrate; forming a resistance adjusting element over at least a portion of the substrate; forming a second voltage line over the substrate, wherein the second voltage line is electrically coupled to the first conductivity region; forming a third voltage line, a fourth voltage line, a first resistive unit and a second resistive unit over the substrate, wherein each of the third voltage line and fourth voltage line are electrically coupled to one of the conductivity regions, wherein the first resistive unit is arranged between the third voltage line and the conductivity region to which the third voltage line is electrically coupled, and wherein the second resistive unit is arranged between the fourth voltage line and the conductivity region to which the fourth voltage line is electrically coupled. The resistive units may be formed such that the resistance adjusting element has at least a portion arranged between one of the resistive units and one of the conductivity regions. An amount of the resistance adjusting element between the first resistive unit and the conductivity region to which the third voltage line is electrically coupled may be different from an amount of the resistance adjusting element between the second resistive unit and the conductivity region to which the fourth voltage line is electrically coupled. The resistance between the third voltage line and the conductivity region to which the third voltage line is electrically coupled may differ from the resistance between the fourth voltage line and the conductivity region to which the fourth voltage line is electrically coupled.

In Example 14, the subject matter of Example 13 may optionally include that the method further includes: forming a first contact to electrically couple the first resistive unit to one of the conductivity regions; and forming a second contact to electrically couple the second resistive unit to one of the conductivity regions. The first and second contacts may be formed such that the resistance adjusting element has at least a portion arranged between one of the first contact and the second contact and one of the conductivity regions.

In Example 15, the subject matter of Example 13 or Example 14 may optionally include that the resistance adjusting element has a portion between one of the resistive units and the conductivity region below the resistive unit, and the resistance adjusting element is absent between the other resistive unit and the conductivity region below the other resistive unit.

In Example 16, the subject matter of Example 13 or Example 14 may optionally include that the resistance adjusting element has a first portion between the first resistive unit and the conductivity region to which the third voltage line is electrically coupled and a second portion between the second resistive unit and the conductivity region to which the fourth voltage line is electrically coupled. A thickness of the first portion may be different from a thickness of the second portion.

In Example 17, the subject matter of any one of Examples 13 to 16 may optionally include that the resistance adjusting element may include silicide.

In Example 18, the subject matter of Example 14 may optionally include that the method further includes forming an insulating layer over the substrate; and forming a first contact hole and a second contact hole in the insulating layer. Forming the resistance adjusting element may include forming a liner lining in at least one of the contact holes.

In Example 19, the subject matter of Example 18 may optionally include that forming a liner lining in at least one of the contact holes may include forming the liner lining in only the second contact hole.

In Example 20, the subject matter of Example 18 may optionally include that forming a liner lining in at least one of the contact holes includes forming a first liner lining in the first contact hole and forming a second liner lining in the second contact hole. A thickness of the first liner may be different from a thickness of the second liner.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A memory device comprising:
a substrate comprising a first conductivity region and a second conductivity region at least partially arranged within the substrate, and a channel region arranged between the first conductivity region and the second conductivity region;
a first voltage line arranged over the channel region;
a second voltage line electrically coupled to the first conductivity region;
a third voltage line electrically coupled to one of the conductivity regions; and
a fourth voltage line electrically coupled to one of the conductivity regions;
a first resistive unit arranged between the third voltage line and the conductivity region to which the third voltage line is electrically coupled, and a second resistive unit arranged between the fourth voltage line and the conductivity region to which the fourth voltage line is electrically coupled, wherein each resistive unit has a resistance configured to switch between a lower resistance value and a higher resistance value;
a resistance adjusting element having at least a portion arranged between one of the resistive units and one of the conductivity regions, wherein an amount of the resistance adjusting element between the first resistive unit and the conductivity region to which the third voltage line is electrically coupled is different from an amount of the resistance adjusting element between the second resistive unit and the conductivity region to which the fourth voltage line is electrically coupled; and
first and second conductive structures adjoining the first and second resistive units respectively, wherein the first conductive structure is arranged between the first resistive unit and the conductivity region to which the third voltage line is electrically coupled, and the second conductive structure is arranged between the second resistive unit and the conductivity region to which the fourth voltage line is electrically coupled, wherein a vertical distance between each conductive structure and the substrate is at most equal to a maximum thickness of the resistance adjusting element, and wherein the first conductive structure is separate from the second conductive structure; and
wherein the resistance between the third voltage line and the conductivity region to which the third voltage line is electrically coupled differs from the resistance between the fourth voltage line and the conductivity region to which the fourth voltage line is electrically coupled.

2. The memory device of claim 1,
wherein the first conductive structure comprises a first contact and the second conductive structure comprises a second contact; and
wherein the at least a portion of the resistance adjusting element is arranged between one of the first contact and the second contact and one of the conductivity regions.

3. The memory device of claim 1, wherein the resistance adjusting element has the at least a portion arranged between the one of the resistive units and the conductivity region below the one of the resistive units, and wherein the resistance adjusting element is absent between the other one of the resistive units and the conductivity region below the other one of the resistive units.

4. The memory device of claim 1, wherein the resistance adjusting element has a first portion between the first resistive unit and the conductivity region to which the third voltage line is electrically coupled, and a second portion between the second resistive unit and the conductivity region to which the fourth voltage line is electrically coupled, and wherein a thickness of the first portion is different from a thickness of the second portion.

5. The memory device of claim 1, wherein the resistance adjusting element comprises silicide.

6. The memory device of claim 5, wherein the resistance adjusting element comprises at least one silicide layer over the substrate in contact with the substrate.

7. The memory device of claim 2, wherein the resistance adjusting element comprises a liner lining a surface of one or both of the first contact and the second contact, wherein the resistance between the one or both of the first contact and the second contact, and the conductivity region below the one or both of the first contact and the second contact is decreased by the liner.

8. The memory device of claim 7, wherein the liner is arranged between one of the resistive units and the conductivity region below the resistive unit; and wherein the liner is absent between the other resistive unit and the conductivity region below the other resistive unit.

9. The memory device of claim 7, wherein the resistance adjusting element comprises:
a first liner between the first resistive unit and the conductivity region to which the third voltage line is electrically coupled; and
a second liner between the second resistive unit and the conductivity region to which the fourth voltage line is electrically coupled;
wherein a thickness of the first liner is different from a thickness of the second liner.

10. The memory device of claim 1, wherein the first and second resistive units are identical.

11. The memory device of claim 1, wherein the third voltage line and the fourth voltage line are electrically coupled to the second conductivity region.

12. The memory device of claim 1, wherein the third voltage line is electrically coupled to the first conductivity region, the fourth voltage line is electrically coupled to the second conductivity region, and the second voltage line is electrically coupled to the third voltage line.

13. A method comprising:
providing a substrate comprising a first conductivity region and a second conductivity region at least partially within the substrate, wherein a channel region is arranged between the first conductivity region and the second conductivity region, and wherein a first voltage line is formed over the channel region of the substrate;
forming a resistance adjusting element over at least a portion of the substrate;
forming a second voltage line over the substrate, wherein the second voltage line is electrically coupled to the first conductivity region;
forming a third voltage line, a fourth voltage line, a first resistive unit, a second resistive unit, and first and second conductive structures over the substrate,
wherein each of the third voltage line and fourth voltage line are electrically coupled to one of the conductivity regions, wherein the first resistive unit is arranged between the third voltage line and the conductivity region to which the third voltage line is electrically coupled, and wherein the second resistive unit is arranged between the fourth voltage line and the conductivity region to which the fourth voltage line is electrically coupled, each resistive unit having a resistance configured to switch between a lower resistance value and a higher resistance value;

wherein the first and second conductive structures adjoin the first and second resistive units respectively, the first conductive structure being arranged between the first resistive unit and the conductivity region to which the third voltage line is electrically coupled, and the second conductive structure being arranged between the second resistive unit and the conductivity region to which the fourth voltage line is electrically coupled, wherein a vertical distance between each conductive structure and the substrate is at most equal to a maximum thickness of the resistance adjusting element, and wherein the first conductive structure is separate from the second conductive structure;

wherein the resistive units are formed such that the resistance adjusting element has at least a portion arranged between one of the resistive units and one of the conductivity regions, wherein an amount of the resistance adjusting element between the first resistive unit and the conductivity region to which the third voltage line is electrically coupled is different from an amount of the resistance adjusting element between the second resistive unit and the conductivity region to which the fourth voltage line is electrically coupled; and wherein the resistance between the third voltage line and the conductivity region to which the third voltage line is electrically coupled differs from the resistance between the fourth voltage line and the conductivity region to which the fourth voltage line is electrically coupled.

14. The method of claim 13, wherein the method further comprises:
forming an insulating layer over the substrate; and
forming a first contact hole and a second contact hole in the insulating layer; and wherein forming the resistance adjusting element comprises:
forming a liner lining in at least one of the contact holes.

15. The method of claim 14, wherein forming a liner lining in at least one of the contact holes comprises forming the liner lining in only the second contact hole.

16. The method of claim 14, wherein forming a liner lining in at least one of the contact holes comprises forming a first liner lining in the first contact hole and forming a second liner lining in the second contact hole, wherein a thickness of the first liner is different from a thickness of the second liner.

17. The memory device of claim 1, wherein the resistance adjusting element adjoins the substrate.

18. The memory device of claim 1, wherein a height of the first conductive structure is approximately equal to a height of the second conductive structure.

19. The memory device of claim 1, wherein the resistance adjusting element comprises a layer arranged along a top surface of the substrate.

20. The memory device of claim 1, wherein the resistance adjusting element comprises a portion arranged between the second voltage line and the first conductivity region.

* * * * *